(12) United States Patent
Kaneko et al.

(10) Patent No.: US 6,641,981 B1
(45) Date of Patent: Nov. 4, 2003

(54) EXPOSURE METHOD, EXPOSURE APPARATUS, AND DEVICE MANUFACTURING METHOD

(75) Inventors: Kenichirou Kaneko, Kawasaki (JP); Toshinobu Morioka, Fujisawa (JP); Seiji Fujitsuka, Kawaski (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/715,080

(22) Filed: Nov. 20, 2000

(30) Foreign Application Priority Data

Nov. 18, 1999 (JP) .......................... 11-327852
Sep. 27, 2000 (JP) ...................... 2000-295127

(51) Int. Cl.[7] .............................. G03F 7/00; G03F 9/00; G03B 27/00
(52) U.S. Cl. ...................... 430/311; 430/322; 430/396; 430/397; 355/53
(58) Field of Search ................. 430/322, 396, 430/397, 30; 355/53

(56) References Cited

U.S. PATENT DOCUMENTS

| | | | | |
|---|---|---|---|---|
| 5,194,893 A | | 3/1993 | Nishi | 355/53 |
| 5,255,050 A | * | 10/1993 | Kitagawa | 355/53 |
| 5,384,464 A | * | 1/1995 | De Fornel et al. | 250/491.1 |
| 5,526,093 A | | 6/1996 | Takahashi | 355/53 |
| 5,631,112 A | * | 5/1997 | Tsai et al. | 430/394 |
| 5,706,077 A | * | 1/1998 | Unno | 355/71 |
| 5,742,376 A | | 4/1998 | Makinouchi | 355/53 |
| 6,063,530 A | * | 5/2000 | Grassmann | 430/30 |
| 6,218,077 B1 | * | 4/2001 | Jin | 430/311 |

* cited by examiner

Primary Examiner—Mark F. Huff
Assistant Examiner—K Sagar
(74) Attorney, Agent, or Firm—Oblon, Spivak, McClelland, Maier & Neustadt, P.C.

(57) ABSTRACT

In projecting a pattern formed on a mask onto a substrate by using a progressive focus exposure method and transferring/forming an image of the pattern on a substrate, a control unit changes the distribution of energy amounts supplied onto the substrate based on the relative positions of the imaging plane and the substrate surface, and the integrated energy amount supplied onto the substrate in accordance with the position of an irradiation area on the substrate surface which is irradiated with an energy beam through the projection optical system. With this operation, in accordance with information about the distribution of variations in resist layer thickness on the substrate, which is obtained in advance, at least one of the distribution of energy amounts and the integrated energy, which reduce the influences of this distribution, can be changed. As a consequence, the depth of focus of the projection optical system can be substantially increased, and variations in the shapes of pattern images formed on a substrate can be suppressed.

26 Claims, 16 Drawing Sheets

Z SWING WIDTH H(μm)
SET EXPOSURE AMOUNT (mJ/cm²)

FIG. 10

| PATTERN | PATTERN SIZE (μm) | | PATTERN POSITION (μm) | | ARRANGEMENT | | ARRANGEMENT PITCH (μm) | | ARRANGEMENT POSITION (μm) | | EXPOSURE ENERGY (mJ) | AF VALUE (μm) | AF VALUE SWING WIDTH (μm) |
|---|---|---|---|---|---|---|---|---|---|---|---|---|---|
| | X | Y | X | Y | COLUMN | ROW | X | Y | X | Y | | | |
| PAa | 80000 | 80000 | 0 | 0 | 2 | 2 | 80000 | 80000 | 0 | 100000 | 40 | 0.5 | 2 |
| PAb | 60000 | 80000 | 20000 | 20000 | 3 | 1 | 80000 | 0 | 40000 | −100000 | 50 | −0.5 | 3 |

FIG. 14A

| PATTERN | PATTERN SIZE (μm) | | PATTERN POSITION (μm) | | ARRANGEMENT | | ARRANGEMENT PITCH (μm) | | ARRANGEMENT POSITION (μm) | | EXPOSURE ENERGY (mJ) | AF VALUE (μm) | AF VALUE SWING WIDTH (μm) |
|---|---|---|---|---|---|---|---|---|---|---|---|---|---|
| | X | Y | X | Y | COLUMN | ROW | X | Y | X | Y | | | |
| PAa | 80000 | 80000 | 0 | 0 | 1 | 1 | 0 | 0 | 0 | 0 | 40 | 0 | 8 |

FIG. 14B

| PATTERN | PATTERN SIZE (μm) | | PATTERN POSITION (μm) | | ARRANGEMENT | | ARRANGEMENT PITCH (μm) | | ARRANGEMENT POSITION (μm) | | EXPOSURE ENERGY (mJ) | AF VALUE (μm) | AF VALUE SWING WIDTH (μm) |
|---|---|---|---|---|---|---|---|---|---|---|---|---|---|
| | X | Y | X | Y | COLUMN | ROW | X | Y | X | Y | | | |
| PAa | 80000 | 80000 | 0 | 0 | 1 | 1 | 0 | 0 | 0 | 0 | 20 | 4 | 0 |
| PAa | 80000 | 80000 | 0 | 0 | 1 | 1 | 0 | 0 | 0 | 0 | 20 | -4 | 0 |

EXPOSURE METHOD, EXPOSURE APPARATUS, AND DEVICE MANUFACTURING METHOD

BACKGROUND OF THE INVENTION

1. Field of the Invention

The present invention relates to an exposure method, exposure apparatus, and device manufacturing method and, more particularly, to an exposure method and apparatus used in a lithography process for manufacturing a semiconductor device, liquid crystal display device, image pick-up device (such as a CCD), thin-film magnetic head, or the like and a device manufacturing method using the exposure method and apparatus in the lithography process.

2. Description of the Related Art

Conventionally, in a lithography process for manufacturing semiconductor devices and the like, various types of exposure apparatuses designed to form predetermined patterns on a substrate such as a wafer or glass plate (to be referred to as a "wafer" or "substrate" hereinafter, as needed). Recently, with increases in the degree of integration of semiconductor devices, the following exposure apparatuses are mainly used: a step-and-repeat type reduction projection exposure apparatus (so-called stepper) capable of transferring fine patterns formed on a mask or reticle (to be generically referred to as a "reticle" hereinafter) onto a plurality of shot areas on a wafer coated with a photoresist through a projection optical system with a relatively high throughput and high precision and a sequential moving type projection exposure apparatus such as a step-and-scan type scanning exposure apparatus (so-called scanning stepper) obtained by improving the above stepper.

The resolution of the projection optical system of such a projection exposure apparatus can be expressed by $R = k_1 \cdot \lambda / N.A.$, as is well-known as the Rayleigh formula, where R is the resolution of the projection optical system, $\lambda$ is the wavelength of exposure light, N.A. is the numerical aperture of the projection optical system, and $k_1$ is a constant determined by the resolution of a photoresist and other processes. To improve the resolution of the projection optical system, therefore, the numerical aperture N.A. may be increased.

A depth of focus DOF of the projection optical system is expressed by $DOF = k_2 \cdot \lambda / (N.A.)^2$ where $k_2$ is a proportional constant. If, therefore, the numerical aperture N.A. is simply increased, the depth of focus DOF may become too small. It is known that when periodic lattice patterns like patterns for memory circuit portions are to be exposed, the depth of focus can be substantially increased, with the resolution being improved, by a so-called modified illumination method of tilting the principal ray of exposure light from an illumination optical system.

It is also known that when isolated patterns such as contact hole patterns are to be exposed, the depth of focus of the projection optical system can be substantially (apparently) increased by a so-called FLEX method, DP exposure method, CDP exposure method, or the like in which the positional relationship between a wafer and the imaging plane of the projection optical system in the optical axis direction of the projection optical system is continuously or intermittently changed according to a desired procedure so that an irradiation area on the wafer surface which is irradiated with exposure light through the projection optical system is always located in a range having a predetermined width in the optical axis direction, which includes the imaging plane, and the distribution of light amounts supplied onto the wafer, corresponding to the relative positions of the imaging plane and wafer surface, becomes a predetermined distribution. Exposure methods of substantially increasing the depth of focus of the projection optical system by continuously or intermittently changing the positional relationship between the imaging plane and the wafer in the optical axis direction of the projection optical system according to the desired procedure will be generically referred to as a progressive focus exposure method hereinafter. For example, the progressive focus exposure method used by a static exposure apparatus such as a stepper is disclosed in, for example, Japanese Patent Laid-Open Nos. 63-42122 and 5-13305. The progressive focus exposure method used by a scanning exposure apparatus such as a scanning stepper is disclosed in, for example, Japanese Patent Laid-Open Nos. 4-277612 and 6-314646.

In the conventional progressive focus exposure method disclosed in each of the above references, when patterns such as contact hole patterns are to be transferred onto a plurality of shot areas on a wafer, exposure is performed under the same conditions (e.g., the relative moving range (so-called Z swing width) of the wafer surface with datum to an imaging plane, light amount) for each shot area.

According to the principle of resist coating by a coater (resist coating unit), the thickness of a photosensitive agent (resist) layer formed on the wafer varies from a central portion to peripheral portion of the wafer. In addition, the thickness distribution of the resist layer on the wafer is unique to each resist coating unit. Conventionally, such variations in resist layer thickness have hardly raised problems. With further increases in the degree of integration of semiconductor devices, accompanied with a reduction in circuit pattern size, and an increase in wafer size, variations in the shapes of isolated pattern images, mainly contact hole pattern images, among shot areas due to variations in resist layer thickness cannot be neglected.

Semiconductor devices will further increase in the degree of integration in the future, and wafers tend to further increase in size. It is therefore expected that variations in the shapes of isolated pattern images such as contact hole pattern images due to the above variations in resist layer thickness will further become noticeable.

In a liquid crystal exposure apparatus or the like, patterns having different shapes are transferred onto a plurality of shot areas on the same substrate with relatively high frequency. Such operation is sometimes performed in a semiconductor exposure apparatus. In such a case, patterns having different shapes are formed in shot areas on the respective layers on the substrate. For this reason, when overlay exposure is performed on a subsequent layer, detection light from a focus sensor for detecting the position (focus position) of the substrate in the optical axis direction of the projection optical system may be affected by stepped portions on the surface due to the shapes of patterns that have already been formed on the substrate or the difference in thickness between resist layers, resulting in a detection error. As in the above case, a plurality of patterns transferred onto the respective shot areas may not be formed in desired shapes with high precision owing to variations in resist layer thickness. When the target value of the focus sensor is fixed, in particular, an actual pattern shape tends to differ from a desired pattern shape. Even if the above progressive focus exposure method is used under the same conditions (e.g., the relative moving range of the wafer surface with datum the imaging surface, so-called Z swing width, light amount, and the like), shape differences occur more or less. The above shape differences inevitably occur almost especially when patterns requiring predetermined shapes in the depth direction such as pixel patterns in a liquid crystal display device and contact hole patterns and other patterns requiring no predetermined shapes in the depth direction such as line-and-space patterns are to be formed on the same layer on the same substrate by exposure.

SUMMARY OF THE INVENTION

The present invention has been made in consideration of the above situation, and has as its first object to provide an exposure method and apparatus which can suppress variations in the shapes of pattern images transferred/formed on a substrate.

It is the second object of the present invention to provide an exposure method and apparatus which can transfer all patterns having different shapes onto the same substrate with high precision in desired shapes.

It is the third object of the present invention to provide a device manufacturing method which can improve the productivity of devices.

As described above, the photosensitive agent (resist) layer formed on the substrate varies in thickness from the central portion to peripheral portion of the substrate. Variations in the thickness of this resist layer at the respective positions on the substrate are determined by each resist coating unit. Therefore, the thickness distribution of a resist layer at the respective positions on a substrate can be obtained in advance by measuring the thickness of the resist layer. It is expected that the above variations in the shapes of pattern images due to variations in resist thickness can be suppressed to a certain degree by using this resist layer thickness distribution data. In consideration of this point, the present invention uses the following techniques and arrangements.

According to the first aspect of the present invention, there is provided a first exposure method of irradiating a mask on which a pattern is formed with an energy beam, and changing a positional relationship between an imaging plane of a projection optical system and a substrate in an optical axis direction of the projection optical system according to a predetermined procedure so that an irradiation area on a substrate surface irradiated with the energy beam through the projection optical system is always located in a range having a predetermined width in the optical axis direction and including the imaging plane, and a distribution of energy amounts supplied onto the substrate with respect to a position of the substrate surface with datum to the imaging plane becomes a desired distribution, thereby transferring the pattern onto the substrate, wherein the distribution of energy amounts in accordance with a position on the substrate of the area which is irradiated with the energy beam is changed in said lithography process upon transferring the pattern onto the substrate.

According to this method, when a pattern formed on a mask is to be projected onto a substrate and an image of the pattern is to be transferred/formed on the substrate by using the above progressive focus exposure method, the distribution of energy amounts supplied onto the substrate with respect to the position of the substrate surface with datum to the imaging plane is changed in accordance with the position of an irradiation area on the substrate which is irradiated with an energy beam through a projection optical system. With this operation, for example, in accordance with the information of the distribution of variations in resist layer thickness on the substrate, obtained in advance, the above distribution of energy amounts associated with the position of the substrate surface with datum to the imaging plane can be changed to reduce the influences of the distribution of variations in resist layer thickness. As a consequence, the depth of focus of the projection optical system can be substantially increased, and variations in the shapes of pattern images formed on the substrate at the respective positions can be suppressed.

In this case, the positional relationship between the imaging plane and the substrate in the optical axis direction of the projection optical system may be continuously changed. Alternatively, the positional relationship between the imaging plane and the substrate in the optical axis direction of the projection optical system may be intermittently changed.

In the first exposure method of the present invention, the distribution of energy amounts may be changed for each position of an area on the substrate which is irradiated with an energy beam through the projection optical system. However, if, for example, a plurality of divided areas are set on the substrate, the distribution of energy amounts may be changed in accordance with the position of a divided area subject to exposure on the substrate. In this case as well, the distribution of energy amounts may be changed for each position of an area on the substrate which is irradiated with an energy beam within one divided area.

In this specification, the expression "changing the distribution of energy amounts in accordance with a position of the area (to be also referred to as an irradiation area hereinafter) on the substrate which is irradiated with the energy beam" indicates when a plurality of divided areas are set on the substrate, both that the distribution of energy amounts in each divided area (the distribution associated with each position on the substrate surface with datum to the imaging plane) is made uniform, and the distribution of energy amounts is changed in units of divided areas, and that the distribution of energy amounts is changed in accordance with the position of an irradiation area in each divided area (in this case, the distribution of energy amounts may be changed or not in units of divided areas).

In the first exposure method of the present invention, the distribution of energy amounts corresponding to a position on the substrate may be a distribution having peaks at a plurality of points including at least two points located near two end portions of the range having the predetermined width on the substrate surface with datum to the imaging plane while a predetermined integrated energy is supplied to each point on the substrate. In this case, the depth of focus of the projection optical system can be substantially increased. In addition, even in scanning exposure, the distribution curve of energy intensity at each point in an irradiation area can be made to have a sharp peak, and hence the resolution of a pattern image can be increased.

In the first exposure method of the present invention, various methods of changing the distribution of energy amounts are conceivable. For example, the speed or the like may be changed to change the positional relationship between the imaging plane and the substrate in the optical axis direction of the projection optical system. The distribution of energy amounts may be changed by changing the predetermined width.

In the first exposure method of the present invention, an integrated energy amount supplied to each point in an area irradiated with the energy beam may also be changed in accordance with a position on the substrate of the area. In this case, the influences of variations in the thickness of the resist layer formed on the substrate at the respective positions on the substrate can be reduced more effectively.

In this case, the integrated energy amount may be changed for each position of an irradiation area on the substrate which is irradiated with an energy beam. However, if, for example, a plurality of divided areas are set on the substrate, the distribution of energy amounts may be changed in accordance with the position of a divided area subject to exposure on the substrate. In this case as well, the distribution of energy amounts may be changed for each position of an irradiation area on the substrate within one divided area.

In this specification, the expression "changing an integrated energy amount supplied to each point in an area (irradiation area) irradiated with the energy beam in accordance with a position on the substrate of the area" indicates both that when a plurality of divided areas are set on the substrate, the integrated energy amount supplied to each point in each divided area is made uniform, and the integrated energy amount supplied to each point is changed in units of divided areas, and that the integrated energy amount supplied to each point is changed in accordance with the position of an irradiation area in each divided area (in this case, the integrated energy amount supplied to each point may be changed or not in units of divided areas).

According to the second aspect of the present invention, there is provided a second exposure method of irradiating a mask on which a pattern is formed with an energy beam, and changing a positional relationship between an imaging plane of a projection optical system and a substrate in an optical axis direction of the projection optical system according to a predetermined procedure so that an irradiation area on a substrate surface irradiated with the energy beam through the projection optical system is always located in a range having a predetermined width in the optical axis direction and including the imaging plane, and a distribution of energy amounts supplied onto the substrate with respect to a position of the substrate surface with datum to the imaging plane becomes a desired distribution, thereby transferring the pattern onto the substrate, wherein an integrated energy amount supplied to each point in an area irradiated with the energy beam is changed in accordance with a position on the substrate of the area upon transferring the pattern onto the substrate.

According to this method, when a pattern formed on a mask is to be projected onto a substrate and an image of the pattern is to be transferred/formed on the substrate by using the above progressive focus exposure method, the integrated energy amount supplied to each point in an area irradiated with an energy beam is changed in accordance with the position of an irradiation area on the substrate which is irradiated with an energy beam through a projection optical system. With this operation, for example, in accordance with the information of the distribution of variations in resist layer thickness on the substrate, obtained in advance, the integrated energy amount supplied to each point on the substrate can be changed to reduce the influences of the variations. As a consequence, the depth of focus of the projection optical system can be substantially increased by the progressive focus exposure method, and variations in the shapes of pattern images formed on the substrate at the respective positions can be suppressed by changing the integrated energy (exposure) amount in accordance with each position.

In this case, the positional relationship between the imaging plane and the substrate in the optical axis direction of the projection optical system may be continuously changed. Alternatively, the positional relationship between the imaging plane and the substrate in the optical axis direction of the projection optical system may be intermittently changed.

In the second exposure method of the present invention, the integrated energy amount may be changed for each position of an area on the substrate which is irradiated with an energy beam through the projection optical system. However, if a plurality of divided areas are set on the substrate, the integrated energy amount may be changed in accordance with a position on the substrate of a divided area subject to exposure. In this case as well, in accordance with the position of an area on the substrate which is irradiated with an energy beam, the integrated energy amount supplied into the area may be changed.

According to the third aspect of the present invention, there is provided a third exposure method of irradiating a mask on which a pattern is formed with an energy beam, and changing a positional relationship between an imaging plane of a projection optical system and a substrate in an optical axis direction of the projection optical system according to a predetermined procedure so that an irradiation area on a substrate surface irradiated with the energy beam through the projection optical system is always located in a range having a predetermined width in the optical axis direction and including the imaging plane, and a distribution of energy amounts supplied onto the substrate with respect to a position of the substrate surface with datum to the imaging plane becomes a desired distribution, thereby transferring the pattern onto the substrate, wherein a plurality of the patterns are prepared, and the distribution of energy amounts is changed in accordance with a pattern subject to transfer upon transferring each of the patterns onto the substrate.

According to this method, when a pattern is to be projected on a substrate by using the above progressive focus exposure method, and an image of the pattern is to be transferred/formed on the substrate, the distribution of energy amounts supplied onto the substrate with respect to the position of the substrate surface with datum to the imaging plane is changed in accordance with the pattern subject to transfer. For this reason, the above distribution of energy amounts with respect to the substrate surface with datum to the imaging plane can be changed to obtain a required depth of focus in accordance with, for example, the information of the state of the substrate surface based on the pattern shape or resist layer thickness. As a consequence, variations in the shapes of pattern images formed on the substrate at the respective positions can be suppressed. Even when, for example, a plurality of patterns having different shapes are to be formed on a substrate, all the patterns can be formed in desired shapes with high precision.

In this case, the positional relationship between the imaging plane and the substrate in the optical axis direction of the projection optical system may be continuously changed. Alternatively, the positional relationship between the imaging plane and the substrate in the optical axis direction of the projection optical system may be intermittently changed.

In the third exposure method of the present invention, an integrated energy amount supplied to each point in an area on the substrate which is irradiated with the energy beam can be changed in accordance with the pattern subject to the transfer.

In the third exposure method of the present invention, the plurality of patterns may be formed on the same mask or may be distributed on a plurality of different masks. In the latter case, a plurality of patterns may be respectively formed on different masks, or a plurality of (e.g., N) patterns may be dispersed on M (<N) different masks, which are smaller in number than the patterns.

According to the fourth aspect of the present invention, there is provided a fourth exposure method of irradiating a plurality of patterns with energy beams, and transferring the plurality of patterns onto a substrate by using a projection optical system, wherein at least one of a position of the substrate with respect to an imaging plane of the projection optical system in an optical axis direction of the projection optical system and a moving amount of the substrate in the optical axis direction of the projection optical system is set in accordance with the pattern subject to transfer upon transferring the pattern onto the substrate.

According to this method, when a pattern is to be transferred onto the substrate, at least one of the position of the substrate in the optical axis direction of the projection optical system with respect to the imaging plane of the projection optical system and the moving amount of the substrate in the optical axis direction of the projection optical system is set in accordance with the pattern subject to transfer. For this reason, when a plurality of pattern having different shapes in the depth direction are to be transferred onto a substrate, since exposure is performed after the position (focus position) of the substrate in the optical axis direction of the projection optical system or the depth of focus is set to an arbitrary value in accordance with each pattern, all the patterns transferred onto the substrate can be formed in desired shapes with high precision.

In this case, the setting can be performed in accordance with at least one of the position of the imaging plane of the projection optical system and the depth of focus.

In the fourth exposure method of the present invention, a plurality of patterns may be transferred on the different substrates and the plurality of patterns may also be transferred onto different areas on the same substrate.

In the fourth exposure method of the present invention, the plurality of patterns can be transferred onto adjacent areas on the substrate so as to join the patterns to each other.

In the fourth exposure method, an integrated energy amount to be supplied to each point in an area on the substrate which is irradiated with the energy beam may be independently set in accordance with the pattern subject to the transfer.

In the fourth exposure method of the present invention, the plurality of patterns may be dispersed on a plurality of masks, and the plurality of masks may be sequentially interchanged and the plurality of patterns may be transferred onto the substrate. In this case, a plurality of patterns may be respectively formed on different masks, or a plurality of (e.g., N) patterns may be distributed on M (<N) different masks, which are smaller in number than the patterns.

According to the fifth aspect of the present invention, there is provided a first exposure apparatus for transferring a pattern formed on a mask onto a substrate through a projection optical system, comprising an illumination system which illuminates the mask with an energy beam, a relative displacement unit which changes a positional relationship between a surface of the substrate and an imaging plane of the projection optical system on which a projected image of the pattern on the mask is formed in an optical axis direction of the projection optical system, and a control unit which changes a positional relationship between the imaging plane and the substrate in the optical axis direction of the projection optical system via the relative displacement unit according to a predetermined procedure so that an irradiation area on the substrate surface which is irradiated with the energy beam through the projection optical system is always located in a range having a predetermined width in the optical axis direction and including the imaging plane of the projection optical system, and a distribution of energy amounts supplied onto the substrate with respect to a position of the substrate surface with datum to the imaging plane becomes a desired distribution, and changes the distribution of energy amounts in accordance with the position on the substrate of the area which is irradiated with the energy beam when the pattern is to be transferred onto the substrate when the pattern is to be transferred onto the substrate.

According to this apparatus, when a pattern formed on a mask is to be projected onto a substrate and an image of the pattern is to be transferred/formed on the substrate by using the above progressive focus exposure method, the control unit changes the distribution of energy amounts supplied onto the substrate with respect to the position of the substrate surface with datum to the imaging plane in accordance with the position of an irradiation area on the substrate which is irradiated with an energy beam through a projection optical system. With this operation, for example, in accordance with the information of the distribution of variations in resist layer thickness on the substrate, obtained in advance, the above distribution of energy amounts, supplied onto the substrate, associated with the position of the substrate surface with datum to the imaging plane can be changed to reduce the influences of the distribution of variations in resist layer thickness. As a consequence, the depth of focus of the projection optical system can be substantially increased, and variations in the shapes of pattern images formed on the substrate at the respective positions can be suppressed.

In this case, the control unit may continuously change the positional relationship between the imaging plane and the substrate in the optical axis direction of the projection optical system. Alternatively, the control unit may intermittently change the positional relationship between the imaging plane and the substrate in the optical axis direction of the projection optical system.

In the first exposure apparatus of the present invention, the control unit may also change an integrated energy amount supplied to each point in an area irradiated with the energy beam in accordance with a position on the substrate of the area. In this case, the influences of variations in the thickness of the resist layer formed on the substrate at the respective positions on the substrate can be reduced more effectively.

According to the sixth aspect of the present invention, there is provided a second exposure apparatus for transferring a pattern formed on a mask onto a substrate through a projection optical system, comprising an illumination system which illuminates the mask with an energy beam, a relative displacement unit which changes a positional relationship between a surface of the substrate and an imaging plane of the projection optical system on which a projected image of the pattern on the mask is formed in an optical axis direction of the projection optical system, and a control unit which changes a positional relationship between the imaging plane and the substrate in the optical axis direction of the projection optical system via the relative displacement unit according to a predetermined procedure so that an irradiation area on the substrate surface which is irradiated with the energy beam through the projection optical system is always located in a range having a predetermined width in the optical axis direction and including the imaging plane of the projection optical system, and a distribution of energy amounts supplied onto the substrate with respect to a position of the substrate surface with datum to the imaging plane becomes a desired distribution, and changes an integrated energy amount supplied to each point in the area in accordance with the position on the substrate of the area which is irradiated with the energy beam when the pattern is to be transferred onto the substrate.

According to this apparatus, when a pattern formed on a mask is to be projected onto a substrate and an image of the pattern is to be transferred/formed on the substrate by using the above progressive focus exposure method, the control unit changes the integrated energy amount supplied to each point in an area irradiated with an energy beam in accordance with the position of an irradiation area on the substrate which is irradiated with an energy beam through a projection optical system. With this operation, for example, in accordance with the information of the distribution of variations in resist layer thickness on the substrate, obtained in advance, the integrated energy amount supplied to each point on the substrate can be changed to reduce the influences of the variations. As a consequence, the depth of focus of the projection optical system can be substantially increased by the progressive focus exposure method, and variations in the shapes of pattern images formed on the substrate at the respective positions can be suppressed by changing the integrated energy amount in accordance with each position.

In this case, the control unit may continuously change the positional relationship between the imaging plane and the substrate in the optical axis direction of the projection optical system. Alternatively, the control unit may intermittently change the positional relationship between the imaging plane and the substrate in the optical axis direction of the projection optical system.

According to the seventh aspect of the present invention, there is provided a third exposure apparatus for irradiating a plurality of patterns with energy beams and transferring the plurality of patterns onto a substrate by using a projection optical system, comprising an illumination system which illuminates the pattern with the energy beam, a control unit which sets at least one of a position of the substrate with respect to the imaging plane of the projection optical system in an optical axis direction of the projection optical system and a moving amount of the substrate in the optical axis direction of the projection optical system in accordance with the pattern subject to transfer when the pattern is to be transferred onto the substrate, and a relative displacement unit which changes a positional relationship between the substrate surface and the imaging plane of the projection optical system on which a projected image of the pattern is formed in the optical axis direction of the projection optical system in accordance with a setting made by the control unit.

According to this apparatus, when a pattern is to be transferred onto the substrate, the control unit sets at least one of the position of the substrate in the optical axis direction of the projection optical system with respect to the imaging plane of the projection optical system and the moving amount of the substrate in the optical axis direction of the projection optical system in accordance with the pattern subject to transfer. The relative displacement unit changes the positional relationship between the substrate and the imaging plane of the projection optical system on which the projected image of the pattern is formed in the optical axis direction of the projection optical system in accordance with the setting made by the control unit. For this reason, when a plurality of patterns having different shapes in the depth direction are to be transferred onto a substrate, since exposure is performed while the position (focus position) of the substrate in the optical axis direction of the projection optical system or the depth of focus is set to a value corresponding to each pattern, all the patterns transferred onto the substrate can be formed in desired shapes with high precision.

In the lithography process, by performing exposure using one of the first to fourth exposure methods of the present invention, variations in the shapes of pattern images formed on a substrate can be suppressed. As a consequence, the yield of devices as final products improves, and the productivity can be improved. Likewise, in the lithography process, by performing exposure using one of the first to third exposure apparatuses of the present invention, variations in the shapes of pattern images formed on the substrate can be suppressed. As a consequence, the yield of devices as final products improves, and the productivity can be improved. According to still another aspect of the present invention, there is provided a device manufacturing method using one of the first to fourth exposure methods of the present invention or one of the first to third exposure apparatuses of the present invention.

BRIEF DESCRIPTION OF THE DRAWINGS

In the accompanying drawings:

FIG. 10 is a view showing an example of data associated with exposure processing, which is registered in advance in a RAM in a control unit in FIG. 9;

FIG. 14A is a view showing table data associated with exposure processing when exposure is performed while a plate stage is continuously moved/controlled in the optical axis direction of the projection optical system, and FIG. 14B is a view showing table data associated with exposure processing when exposure is performed while the plate stage is moved/controlled stepwise in the optical axis direction of the projection optical system;

DESCRIPTION OF THE PREFERRED EMBODIMENTS

First Embodiment

The first embodiment of the present invention will be described below with reference to FIGS. 1 to 6B.

Figure 1:
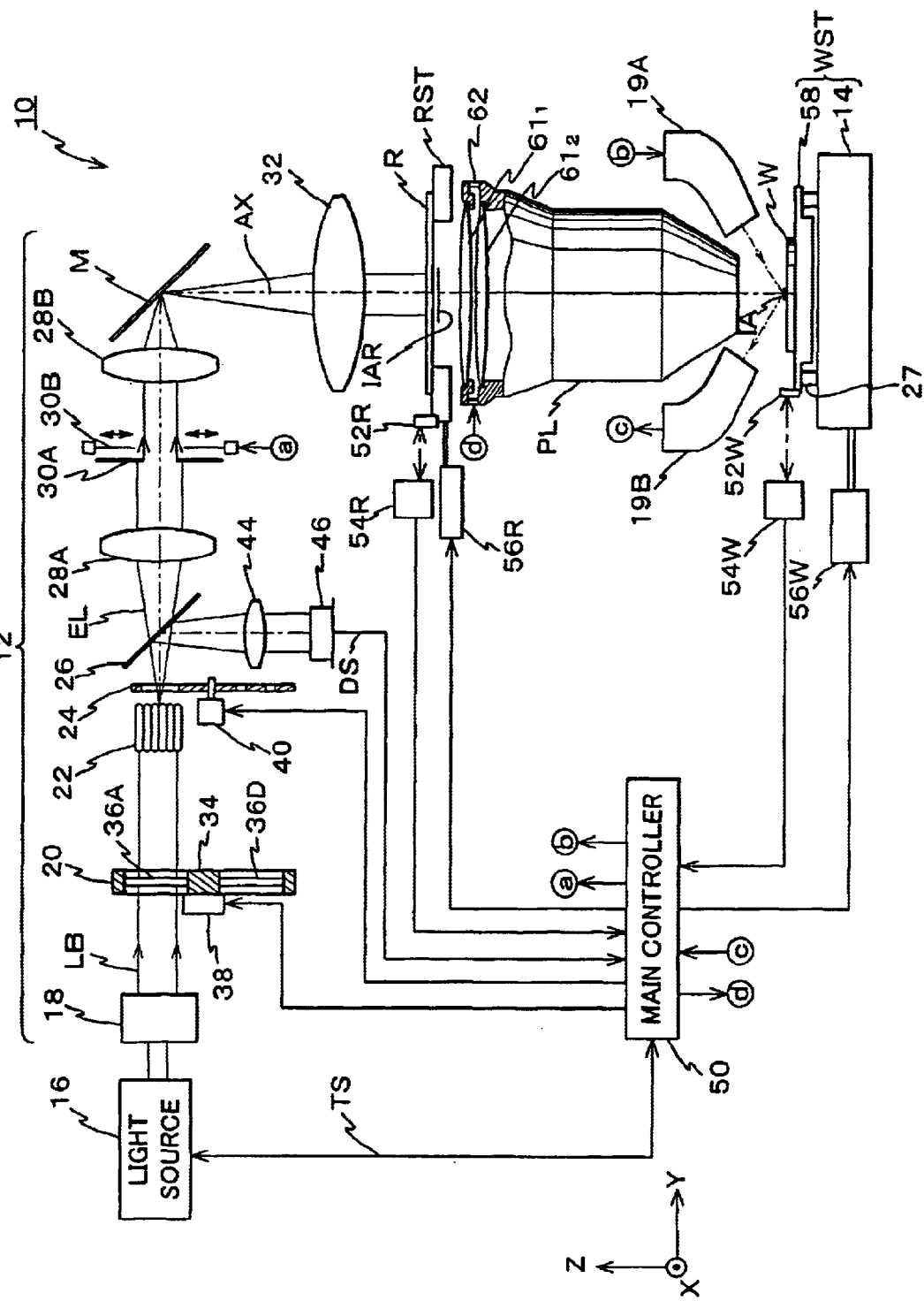
FIG. 1 is a view schematically showing the overall arrangement of an exposure apparatus according to the first embodiment of the present invention.

FIG. 1 schematically shows the arrangement of an exposure apparatus 10 according to the first embodiment. This exposure apparatus 10 is a scanning exposure apparatus based on a step-and-scan method, a so-called scanning stepper, which transfers patterns formed on a reticle R as a mask onto a plurality of shot areas SA (see FIG. 6A), which are divided areas on a wafer W as a substrate, through a projection optical system PL while synchronously moving the reticle R and wafer W.

The exposure apparatus 10 includes a light source 16, an illumination optical system 12, a reticle stage RST for holding the reticle R illuminated by the illumination optical system 12, the projection optical system PL for projecting the patterns formed on the reticle R onto the wafer W, a wafer stage WST having a Z tilt stage 58 for holding the wafer W and an X-Y stage 14 on which the Z tilt stage 58 is mounted, a control system for these components, and the like.

As the light source 16, an excimer laser light source such as a KrF excimer laser light source (output wavelength: 248 nm) or ArF excimer laser light source (output wavelength: 193 nm) is used. In practice, the light source 16 is installed in a place separated from a chamber (not shown) in which the exposure apparatus body made up of the illumination optical system 12, reticle stage RST, projection optical system PL, wafer stage WST, and the like is housed; the light source 16 is installed in a service room with a low cleanliness, which is different from the clean room in which the chamber is installed. The light source 16 is connected to the illumination optical system 12 through a guiding optical system (not shown). Note that as a light source, a vacuum ultraviolet light source such as an $F_2$ laser light source (output wavelength: 157 nm), a pulse light source for emitting another kind of ultraviolet light, or a continuous light source (e.g., a mercury lamp) for emitting continuous light such as an i line may be used.

The illumination optical system 12 includes a beam shaping optical system 18, a coarse energy adjuster 20, a fly-eye lens 22 as an optical integrator (homogenizer), an illumination system aperture stop plate 24, a beam splitter 26, a first relay lens 28A, a second relay lens 28B, a fixed reticle blind 30A, a movable reticle blind 30B, an optical path bending mirror M, a condenser lens 32, and the like. Each component of the illumination optical system 12 will be described below.

The beam shaping optical system 18 shapes the cross-sectional shape of a laser beam LB emitted from the laser light source 16 by pulse emission to allow the laser beam LB to be efficiently incident on the fly-eye lens 22 disposed in a rearward position of the optical path of the laser beam LB. For example, the beam shaping optical system 18 is formed by a cylinder lens or beam expander (neither is shown in FIGS.).

The coarse energy adjuster 20 is disposed on the optical path of the laser beam LB behind the beam shaping optical system 18. In this case, a plurality of (e.g., six) ND filters (FIG. 1 shows two ND filters 36A and 36D of the ND filters) having different transmittances (=1—attenuation ratio) are arranged around a rotating plate 34. The transmittance with respect to the incident laser beam LB can be switched in steps from 100% in a geometric series manner by rotating the rotating plate 34 using a driving motor 38. The driving motor 38 is controlled by a main controller 50 (described later). Note that the transmittance may be adjusted more finely by preparing another rotating plate identical to the rotating plate 34 and using two combined sets of the ND filter.

The fly-eye lens 22 is located on the optical path of the laser beam LB emerging from the coarse energy adjuster 20 to form a surface light source (secondary source) consisting of many point light sources at its exit end so as to illuminate the reticle R with light exhibiting a uniform illuminance distribution. A laser beam emerging from this secondary light source will be referred to as "exposure light EL" hereinafter. Note that a rod lens (internal reflection type integrator) as an optical integrator may be used in place of the fly-eye lens 22.

The illumination system aperture stop plate 24 formed by a disk-like member is disposed near the exit surface of the fly-eye lens 22. For example, the following aperture stops (only two types of aperture stops are shown in FIG. 1) are formed in the illumination system aperture stop plate 24 at almost equal angular intervals: an aperture stop formed by a general circular aperture, an aperture stop formed by a small circular aperture and designed to reduce the a value which is a coherence factor, an annular aperture stop for annular illumination, and a deformation aperture stop formed by eccentrically positioning a plurality of apertures for a deformation light source method. The illumination system aperture stop plate 24 is rotated by a driving unit 40 such as a motor which is controlled by the main controller 50 (to be described later). With this operation, one of the aperture stops is selectively set on the optical path of the exposure light EL.

The beam splitter 26 having a low reflectivity and a high transmittance is disposed on the optical path of the exposure light EL emerging from the illumination system aperture stop plate 24. In addition, a relay optical system constituted by the first and second relay lenses 28A and 28B with the fixed reticle blind 30A and movable reticle blind 30B being interposed therebetween is disposed on the optical path behind the beam splitter 26.

The fixed reticle blind 30A is disposed on a plane that is slightly defocused from a plane conjugate to the pattern surface of the reticle R, and has a rectangular opening for defining an illumination area IAR on the reticle R. The movable reticle blind 30B having an opening portion that is variable in position and width in the scanning direction (and in the non-scanning direction) is disposed near the fixed reticle blind 30A. At the start and end of scanning exposure, the illumination area IAR and an exposure area IA are further restricted through the movable reticle blind 30B to prevent exposure on an unnecessary portion.

Figure 2A:
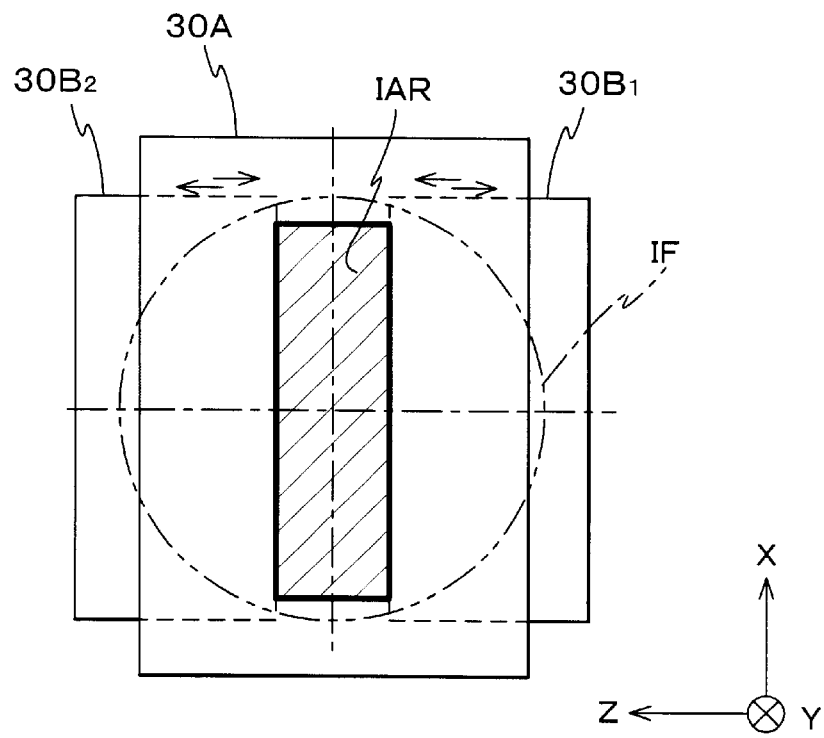
FIG. 2A is a view showing an exposure area defined by a reticle blind mechanism in FIG. 1.

FIG. 2A conceptually shows how the illumination area IAR (hatched portion) is defined by the fixed reticle blind 30A described above. FIG. 2A is a view showing the fixed reticle blind 30A viewed from the −Y direction. The Z-axis direction in FIG. 2A corresponds to the Y-axis direction as the scanning direction on the reticle R; and the Y-axis direction, the direction of the optical axis AX. As is obvious from FIG. 2A, the rectangular slit-like opening of the fixed reticle blind 30A is imaged on the pattern surface of the reticle R to define the rectangular, slit-like illumination area IAR. In this case, the illumination area IAR extends in the X-axis direction as a non-scanning direction in the center of a circular projection field IF of the projection optical system. The width of the illumination area IAR in the scanning direction (Y-axis direction) is constant.

Referring back to FIG. 1, the optical path bending mirror M for reflecting the exposure light EL transmitted through the second relay lens 28B toward the reticle R is disposed on the optical path of the exposure light EL behind the second relay lens 28B of the relay optical system. The condenser lens 32 is disposed on the optical path the exposure light EL behind the optical path bending mirror M.

The operation of the illumination system 12 having this arrangement will be briefly described below. The laser beam LB emitted from the excimer laser light source 16 by pulse emission is incident on the beam shaping optical system 18, in which the cross-sectional shape of the laser beam LB is shaped such that the laser beam can be efficiently incident on the fly-eye lens 22. The laser beam LB is then incident on the coarse energy adjuster 20. The laser beam LB is transmitted through one of the ND filters of the coarse energy adjuster 20 and incident on the fly-eye lens 22. With this operation, the secondary light source described above is formed at the exit end of the fly-eye lens 22. The exposure light EL emerging from the secondary light source passes through one of the aperture stops on the illumination system aperture stop plate 24 and reaches the beam splitter 26 having a high transmittance and a low reflectivity. The exposure light EL transmitted through the beam splitter 26 passes through the rectangular opening portion of the fixed reticle blind 30A and movable reticle blind 30B through the first relay lens 28A. The exposure light EL then passes through the second relay lens 28B, and its optical path is vertically bent downward by the return mirror M. Thereafter, the exposure light EL passes through the condenser lens 32 and illuminates a predetermined illumination area IAR (a slit-like or rectangular illumination area extending straight in the X-axis direction) on the reticle R, held on the reticle stage RST, with a uniform illuminance distribution.

The exposure light EL reflected by the beam splitter 26 is received by an integrator sensor 46 formed by a silicon photodiode or a photodetector having a GaN-based crystal through a condenser lens 44. A photoelectric conversion signal (an electrical signal corresponding to a detected energy amount) from the integrator sensor 46 is supplied as an output DS (digit/pulse) to the main controller 50 through a peak hold circuit and A/D converter (neither is shown).

The reticle R is placed on the reticle stage RST and chucked/held through a vacuum chuck (not shown) or the like. The reticle stage RST can be finely driven within a horizontal plane (X-Y plane) and can also be driven in the scanning direction (the Y direction which is the lateral direction on the drawing surface of FIG. 1 in this case) in a predetermined stroke range by a reticle stage driving portion 56R. The position of the reticle stage RST during this scanning operation is measured by an external laser interferometer 54R through a movable mirror 52R fixed on the reticle stage RST. The measurement value obtained by this laser interferometer 54R is supplied to the main controller 50.

Note that materials must be selectively used for the reticle R depending on the light source (exposure wavelength) to be used. More specifically, if a KrF excimer laser light source or ArF excimer laser light source is used as the light source, synthetic quartz can be used. If, however, an $F_2$ excimer laser light source is used, the reticle R must be made of fluorite, fluorine-doped quartz, or the like.

As the above projection optical system PL, a refraction system which is a two-sided telecentric reduction system and made up of a plurality of lens elements $61_1$, $61_2$, . . . that have a common optical axis AX in the Z-axis direction is used. This projection optical system PL has a projection magnification P of, e.g., ¼, 1/5, or ⅙. For this reason, when the illumination area IAR on the reticle R is illuminated with the exposure light EL in the above manner, an image (partial inverted image) of a circuit pattern formed on the illumination area portion, which is reduced by the projection optical system PL at the above projection magnification, is transferred/formed onto a slit-like exposure area IA, which is conjugate to the illumination area IAR, on the wafer W coated with a photoresist (photosensitive agent).

In this embodiment, the projection optical system PL incorporates a mechanism for moving the position of the imaging plane of the projection optical system PL. More specifically, a lens holder holding the lens element $61_1$ located nearest to the reticle R in the projection optical system PL is supported by an actuator 62 formed by a piezoelectric element at three different points. The main controller 50 changes the thickness of the actuator 62 through a lens controller (not shown) to adjust the interval between the lens element $61_1$, located nearest to the reticle R and the lens element $61_2$ located second nearest to the reticle R, thereby adjusting the position of the imaging plane of the projection optical system PL within a predetermined range in the Z-axis direction.

When an ArF excimer laser beam or KrF excimer laser beam is used as the exposure light EL, synthetic quartz or fluorite can be used for the respective lens elements constituting the projection optical system PL. When, however, an $F_2$ excimer laser beam is used, fluorite is used alone as a material for the lenses used for this projection optical system PL.

The wafer stage WST includes the X-Y stage 14 and Z tilt stage 58. The X-Y stage 14 is two-dimensionally driven in the Y-axis direction which is the scanning direction and the non-scanning direction (X-axis direction) which is perpendicular to the Y-axis direction and also finely driven in the rotational direction around the Z-axis by a driving system formed by a magnetic levitation type two-dimensional linear actuator (plane motor) and the like. The Z tilt stage 58 is mounted on the X-Y stage 14 to hold the wafer W coated with a photoresist through a wafer holder (not shown) by vacuum chucking or the like.

Note that the photoresist (to be referred to as the "resist" hereinafter) on the wafer W is formed (by spin coating) to a thickness of about 1 µm before exposure by dropping the resist on the surface of the wafer W and rotating the wafer W at a high speed (3,000 to 6,000 rpm) using a coater (resist coating apparatus) or coater/developer (resist coating/developing apparatus) (not shown). Basically, in spin coating by a coater or coater/developer, the resist film tends to be thicker toward the rotation center and thinner toward the periphery by centrifugal force. Recently, however, a wafer used in an exposure apparatus needs to have a pattern forbidden band having a width of several mm near its peripheral portion (edge), and hence spin coating is performed while stopper such as a tape is stuck on the corresponding portion. For this reason, the resist film tends to be thinner toward the rotation center and thicker toward the periphery (see FIG. 6B). In any case, the resister film formed on a wafer is not uniform and exhibits a film thickness distribution unique to the coater or coater/developer.

The Z tilt stage 58 is mounted on the X-Y stage 14 while it is positioned in the X and Y directions and allowed to move and tilt in the Z-axis direction. The Z tilt stage 58 is supported on three shafts 27 (an illustration of the shaft 27 on the back side on the drawing surface of FIG. 1 is omitted) at three different support points. These three shafts 27 are independently driven in the Z-axis direction by a driving system to set the surface position of the wafer W (the position in the Z-axis direction and tilt with respect to the X-Y plane) held on the Z tilt stage 58 in a desired state.

Referring to FIG. 1, driving systems for the X-Y stage 14 and Z tilt stage 58 are represented as a wafer stage driving portion 56W. Assume therefore that the X-Y stage 14 and Z tilt stage 58 will be driven by the wafer stage driving portion 56W in the above manner in the following description.

A movable mirror 52W for reflecting a laser beam from a laser interferometer 54W is fixed on the Z tilt stage 58, and the X and Y positions of the Z tilt stage 58 are always detected with a resolution of about 0.5 to 1 nm by the laser interferometer 54W placed outside.

In practice, a movable mirror having a reflecting surface orthogonal to the Y-axis direction that is the scanning direction and a movable mirror having a reflecting surface orthogonal to the X-axis direction that is the non-scanning direction are mounted on the Z tilt stage 58, and a plurality of interferometers are disposed to vertically irradiate these reflecting surfaces with measurement beams, respectively. FIG. 1 shows the movable mirror 52W and laser interferometer 54W as representative examples. The measurement values based on the measurement axes of the respective interferometers constituting the laser interferometer 54W are sent to the main controller 50. The main controller 50 calculates the X and Y positions and yawing amount of the Z tilt stage (i.e., the wafer W) on the basis of these measurement values, and controls the position (including rotation) of the X-Y stage 14 in the X-Y plane through the wafer stage driving portion 56W on the basis of the calculation result.

This embodiment also includes a focus detection system 19 based on the oblique incident light method, which detects the position of a portion in the exposure area IA on the surface of the wafer W and its neighboring area in the Z direction (the direction of the optical axis AX). This focus detection system 19 is comprised of an illumination optical system 19A and light-receiving optical system 19B. As this focus detection system 19, for example, the multi-focal position detection system disclosed in Japanese Patent Laid-Open No. 6-283403 and U.S. Pat. No. 5,448,332 corresponding thereto, etc. is used. An output from the focus detection system 19 is supplied to the main controller 50. The main controller 50 then performs so-called focus/leveling control by controlling the Z tilt stage 58 on the basis of the output from the focus detection system 19. Note that the disclosure in the reference is incorporated in the specification of the present invention.

Referring to FIG. 1, the control system is mainly formed by the main controller 50 serving as a control unit. The main controller 50 includes a so-called microcomputer (or workstation) constituted by a CPU (Central Processing Unit), ROM (Read Only Memory), RAM (Random Access Memory), and the like, and in addition to the above focus leveling control systematically controls synchronous scanning of the reticle R and wafer W, stepping of the wafer W, exposure timing, and the like to accurately perform exposure operation. In this embodiment, the main controller 50 also controls the integrated exposure amount for the wafer W in scanning exposure, as will be described later.

More specifically, for example, in scanning exposure, the main controller 50 controls the positions and speeds of the reticle stage RST and wafer stage WST through the reticle stage driving portion 56R and wafer stage driving portion 56W on the basis of the measurement values obtained by the laser interferometers 54R and 54W so that the wafer W is scanned with respect to the exposure area IA in the −Y direction (or +Y direction) at a speed $V_W = \beta \cdot V$ ($\beta$ is the projection magnification of the reticle R onto the wafer W) through the wafer stage WST in synchronism with scanning of the reticle R in the +Y direction (or −Y direction) at a speed $V_R = V$ through the reticle stage RST. In stepping operation, the main controller 50 controls the position of the wafer stage WST through the wafer stage driving portion 56W on the basis of the measurement value obtained by the laser interferometer 54W.

In the above scanning exposure operation, to supply, to the wafer W, the integrated exposure amount determined in accordance with an exposure condition, photoresist sensitivity, and photoresist film thickness (to be described later), the main controller 50 controls the oscillation frequency (emission timing), emission power (energy), and the like of the light source 16 by supplying control information TS to the light source 16. Alternatively, the main controller 50 adjusts the amount of the exposure light EL applied to the reticle R by controlling the coarse energy adjuster 20 through the motor 38. Control on the integrated exposure amount on the wafer W will be described later. The main controller 50 controls the illumination system aperture stop plate 24 through the driving unit 40, and also controls the opening/closing operation of the movable reticle blind 30B in synchronism with stage operation information.

As described above, in this embodiment, the main controller 50 also serves as an exposure controller (exposure amount control unit) and stage controller (stage control unit). Obviously, however, these controllers may be prepared independently of the main controller 50.

A progressive focus exposure method using the exposure apparatus 10 according to this embodiment will be described with reference to FIGS. 3A to 5.

Figure 3A:
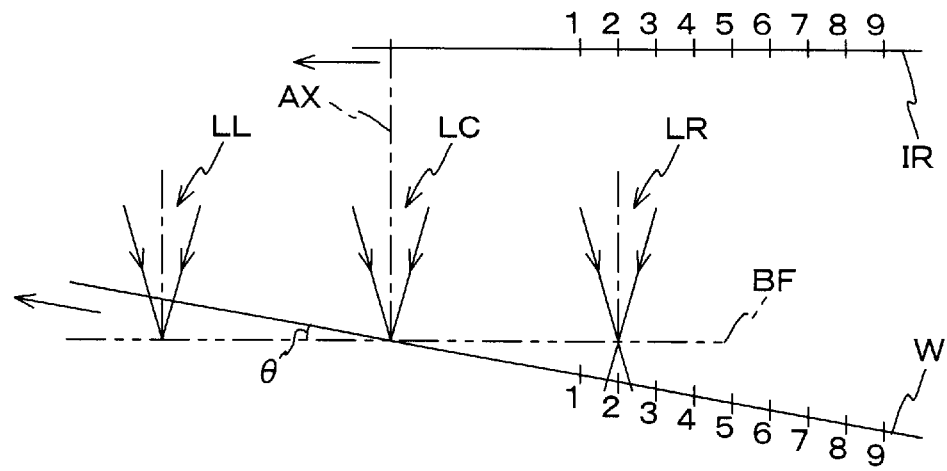
FIGS. 3A to 3C are views for explaining an exposure method according to the first embodiment.
Figure 3B:
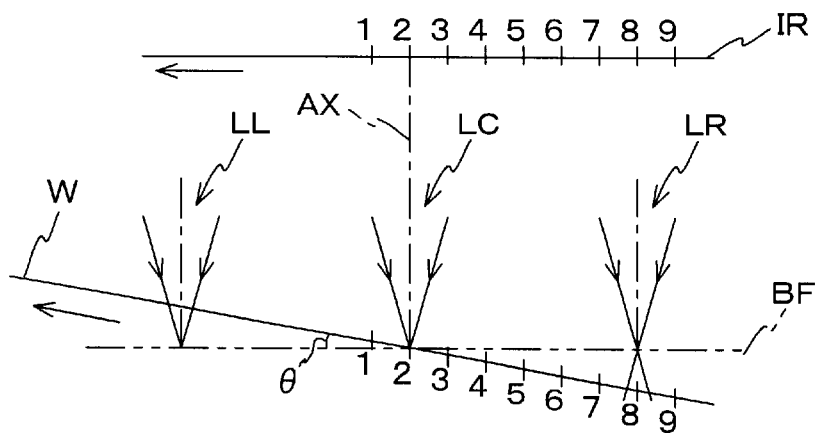
Figure 3C:
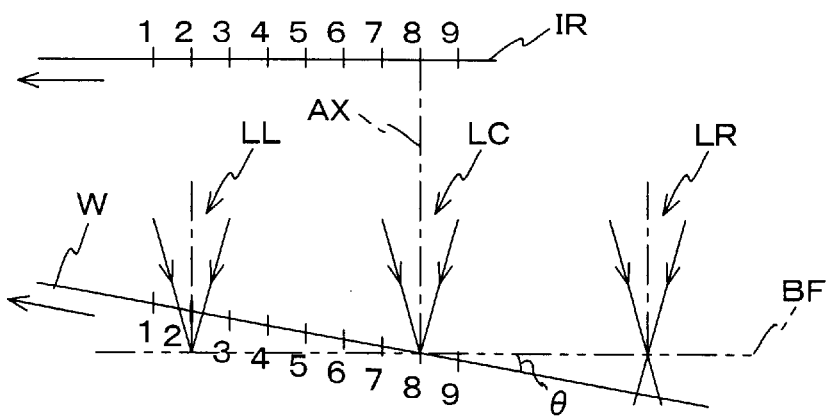

FIGS. 3A to 3C schematically show a circuit pattern IR formed on the reticle R and a portion of the wafer W to provide a visual understanding of the progressive focus exposure method according to this embodiment. Referring to FIGS. 3A to 3C, for the sake of descriptive convenience, the projection magnification $\beta$ of the projection optical system PL is set to 1. Position numbers 1 to 9 are set on the circuit pattern IR for the sake of descriptive convenience. Position numbers 1 to 9 are also set on the wafer W. Position numbers on the wafer W respectively correspond to position numbers 1 to 9 on the reticle R. A pattern is transferred to a position on the wafer W which is indicated by the same number as that of the circuit pattern IR on the reticle R. As described above, the wafer W is held by the Z tilt stage 58. In this embodiment, the Z tilt stage 58 is tilted at a predetermined angle θ with respect to a plane (in the horizontal direction) perpendicular to the optical axis AX.

Exposure light beams in the illumination area IAR defined by the fixed reticle blind 30A are projected on the wafer W through the projection optical system PL. FIGS. 3A to 3C show three representative light beams LR, LC, and LL of these light beams. The light beams LR and LL are light beams at two ends of an exposure light beam irradiation range, in the scanning direction, which are almost symmetrical about the optical axis AX with respect to the scanning direction. The distance between the light beams LR and LL corresponds to the width of the opening of the fixed reticle blind 30A in the scanning direction. The area between these light beams LR and LL represents the exposure light beam irradiation range. In the exposure light beam irradiation range, the intensity distribution of exposure light beams is almost uniform. Assume that the light beam LC has a principal ray passing through almost the center of the exposure light beam irradiation range, and this principal ray coincides with the optical axis of the projection optical system PL. A best imaging plane BE of the projection optical system PL is indicated by the chain double-dashed line (virtual line).

In scanning exposure, the main controller 50 drives the X-Y stage 14 in the Y-axis direction and, at the same time, drives the Z tilt stage 58 in the direction of the optical axis AX such that almost the center of the exposure area IA of the wafer W (almost the center of the exposure light beam irradiation range) is always located on the best imaging plane BF of the projection optical system PL. In this case, the main controller 50 adjusts the tilt angle $\theta$ to satisfy Z swing width $D \cdot \sin\theta \approx \Delta Z$, where D is the width of the exposure area IA on the wafer W in the scanning direction, $\theta$ is the tilt angle defined by the exposure area IA and the best imaging plane BF, and $\Delta Z$ is the width (DOF) of the depth of focus of the projection optical system PL in the direction of the optical axis. Note that if a blind of a type that can adjust the width of the opening in the scanning direction is to be used as the fixed reticle blind 30A, the width D may be adjusted.

A scanning exposure method (progressive focus exposure method) according to this embodiment will be described sequentially. FIG. 3A shows the positional relationship between exposure light beams and the wafer W and circuit pattern IR immediately after scanning exposure is started. Consider position 2 in the circuit pattern IR. Position 2 is located inside the exposure light beam irradiation range, and irradiated with the light beam LR. In this state, an image at position 2 on the wafer W which is irradiated with the light beam LR is in a defocused state, and the intensity distribution of the projected image has a moderate peak. As the scanning exposure progresses, the state shown in FIG. 3B appears, in which position 2 on the wafer W is located on the best imaging plane BF. In this state, the image at position 2 is in the best focus state, and the intensity distribution of the image has a sharp peak. When the reticle R and wafer W move to the positions shown in FIG. 3C, the image at position 2 is set in a reverse defocused state to the state shown in FIG. 3A, and the intensity distribution of the image formed by the light beam LL has a moderate peak.

Figure 4A:
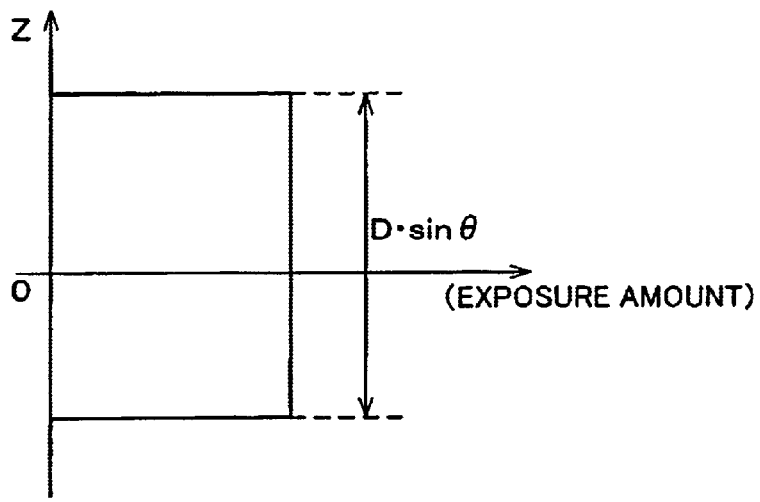
FIG. 4A is a view showing the distribution of exposure amounts (energy amounts) at an arbitrary position on a wafer in the exposure method according to the first embodiment.

FIG. 4A shows the distribution of exposure amounts (energy amounts) at position 2 on the wafer W in the direction of the optical axis AX (Z-axis direction) in the above scanning exposure (constant velocity scanning). More specifically, the exposure amount at position 2 is almost uniform within the range of Z swing width $D \cdot \sin\theta$ ($\approx \Delta Z$) in the Z-axis direction, centered on the best imaging plane. This indicates that when the wafer surface moves within the range of $D \cdot \sin\theta$, the light amount of an isolated pattern formed on the resist layer, e.g., a contact hole image, is almost constant within the range of $D \cdot \sin\theta$. That is, obtaining an almost constant light amount (contact hole image) throughout a long range in the optical axis direction indicates that the depth of focus substantially (apparently) increases.

Figure 4B:
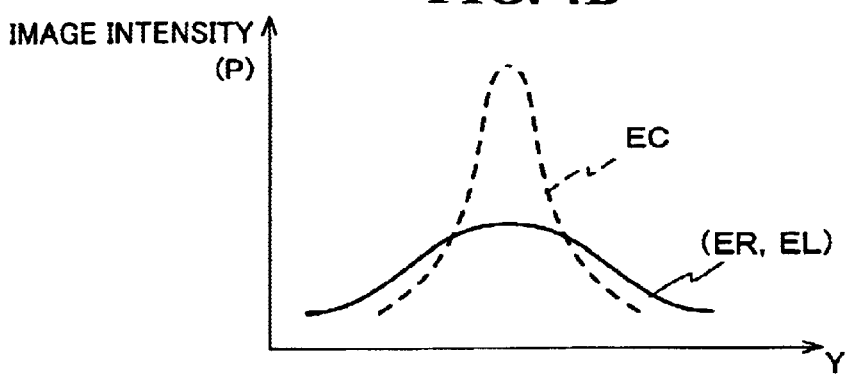
FIG. 4B is a view showing the intensity distribution of an image at an arbitrary position on the wafer in the exposure method according to the first embodiment.
Figure 4C:
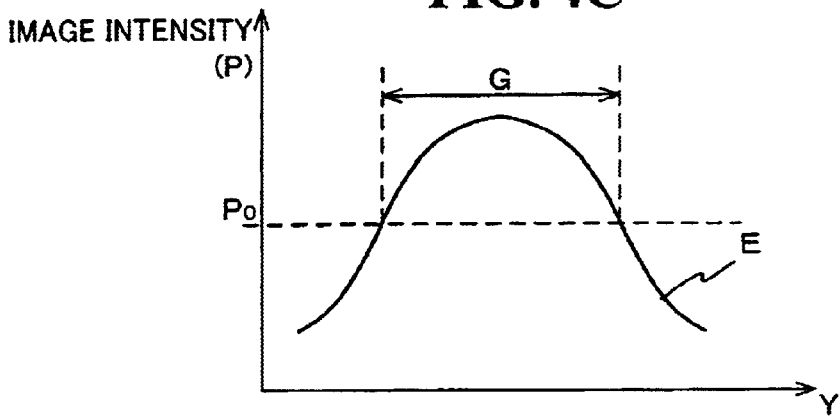
FIG. 4C is a view showing the distribution of the integrated image intensities of all light beams in an exposure area.

FIGS. 4B and 4C show the intensity distributions of the images formed at position 2 by the above scanning exposure. In this case, intensity distributions ER, EC, and EL in FIG. 4B respectively represent the image intensities obtained by the light beams LR, LC, and LL. An intensity distribution E in FIG. 4C represents the integrated value of the image intensities obtained by exposure light beams including the light beams LR, LC, and LL. In this case, a light beam is irradiated (light energy is received) at position 2 while it is located within the exposure light beam irradiation range, and hence the integrated image intensity distribution E has a moderate peak. In this case, a portion that exhibits intensities equal to or higher than a threshold $P_0$ of integrated energy for sensitizing (completely removing) the resist on the wafer W has a width G in FIG. 4C. This width G determines the resolution of a pattern. In order to accurately transfer/form a fine pattern on the wafer W, therefore, the width G is preferably reduced.

To reduce the width G, a rectangular illumination light beam distribution may be maximized at at least two points in the scanning direction. For this purpose, for example, in place of the fixed reticle blind 30A, a fixed reticle blind 30A' is used, which has openings in the form of double slits with a light-shielding portion being formed in the middle. With the use of this fixed reticle blind 30A', the exposure amount at an arbitrary position (e.g., position 2 described above) on the wafer W in scanning exposure has the distribution shown in FIG. 5A in the direction of the optical axis AX. More specifically, the exposure amount at position 2 exhibits similar intensities (peaks) at two points near the two ends of the range of Z swing width $D \cdot \sin\theta$. As a consequence, only portions corresponding to the light beams LL and LR of the exposure light beams shown in FIGS. 3A to 3C can be made to have intensities.

Figure 5A:
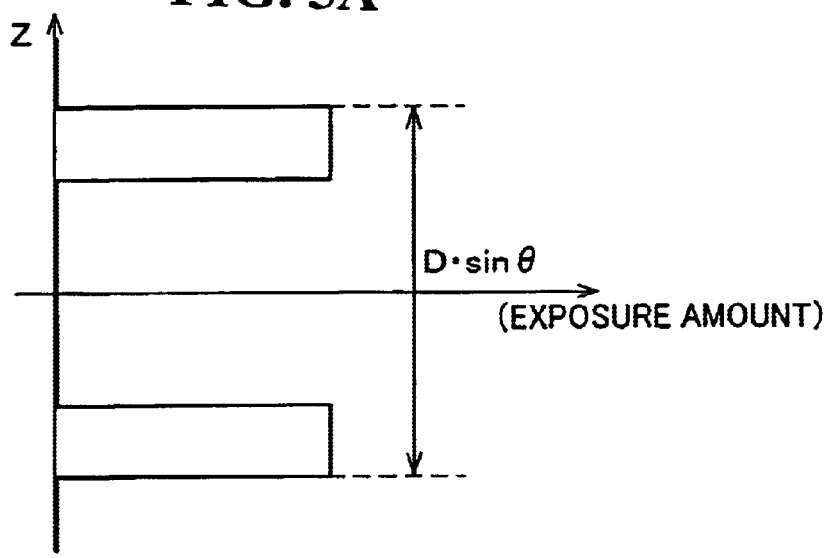
FIGS. 5A to 5C are views for explaining the effects obtained by using the reticle blind mechanism in FIG. 2B, respectively corresponding to FIGS. 4A to 4C.
Figure 5B:
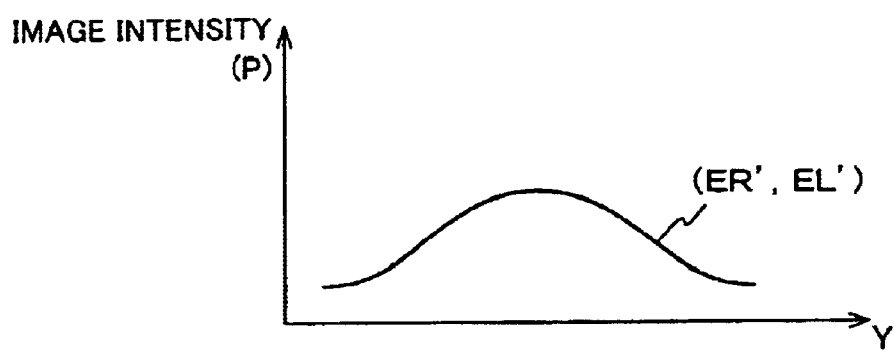
Figure 5C:
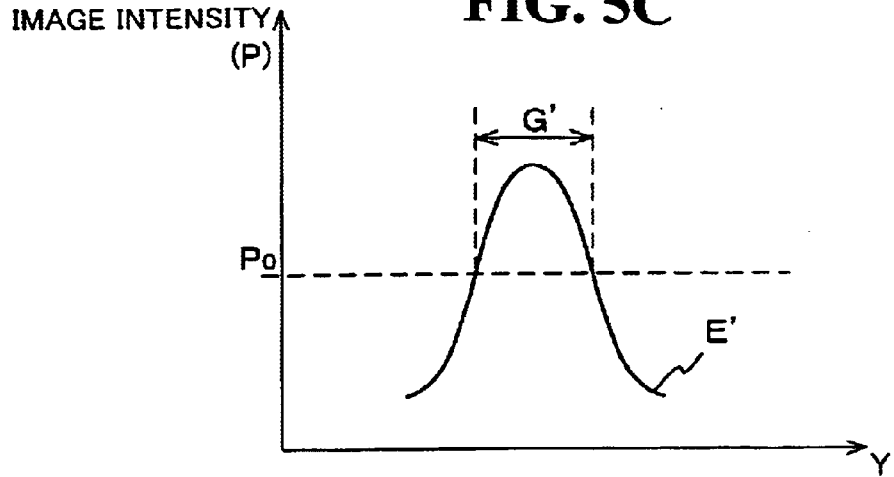

FIGS. 5B and 5C show the intensity distributions of the images obtained at an arbitrary position (e.g., position 2 described above) on the wafer W when scanning exposure similar to that described above is performed using the fixed reticle blind 30A'. Intensity distributions ER' and EL' in FIG. 5B respectively represent the image intensities obtained by the light beams LR and LL. An intensity distribution E' in FIG. 5C represents the integrated value of image intensities obtained by exposure light beams including the light beams LR and LL. As is obvious from a comparison between FIGS. 5C and 4C, the intensity distribution E' has a sharper peak than the intensity distribution E, and a width G' of a portion exhibiting intensities equal to or higher than the threshold $P_0$ of the integrated energy for sensitizing (completely removing) the resist on the wafer W is smaller than the width G. By using the fixed reticle blind 30A' having openings in the form of double slits, therefore, the depth of focus can be substantially increased, and high-resolution exposure can be performed to obtain an isolated pattern, e.g., a contact hole image, with little blur.

In addition, with the use of the above progressive focus exposure method, even if the wafer W has projections and recesses, patterns can be transferred onto both the projection portion and the recess portion with the same precision as described above.

As is obvious from the above description, according to the progressive focus exposure method of this embodiment, since the depth of focus can be substantially increased, isolated patterns can be transferred with high precision. However, as described above, the resist layer formed on the surface of the wafer W varies in thickness on a portion near the center of the wafer W and its peripheral portion. For this reason, the isolated patterns transferred onto the respective shot areas on the wafer W may vary in shape.

The flow of exposure operation will be described in detail below, including a method of solving the above problem that the isolated patterns vary in shape.

Assume that before the start of exposure operation, an operator inputs information about the relationship between the position (distance) from the rotation center of the wafer W and the thickness of a resist layer, exposure conditions (e.g., information associated with illumination conditions and a reticle), and the like to the main controller 50, and the main controller 50 generates a file called a process program and stores it in a RAM. In this embodiment, this process program file contains information about a Z swing width H (equivalent to D·sinθ described above) corresponding to the resist layer thickness in each shot area, calculated on the basis of the relationship between the position (distance) from the rotation center of the wafer W and the thickness of the resist layer and the position information of each shot area on the wafer W and also contains the target integrated exposure amount (target integrated energy amount) for each shot area. Note that the relationship between the position (distance) from the rotation center of the wafer W and the thickness of a resist film may be obtained by selecting one wafer (or a plurality of wafers) from a plurality of wafers coated with a resist as a representative, and optically measuring the thickness distribution of the photoresist film formed on the wafer with a measurement device (not shown). Alternatively, if the resist film thickness distribution characteristic of a coater/developer or the like used to coat the wafer W with a resist is set as a value unique to the apparatus in advance, the set value may be used.

Figure 6A:
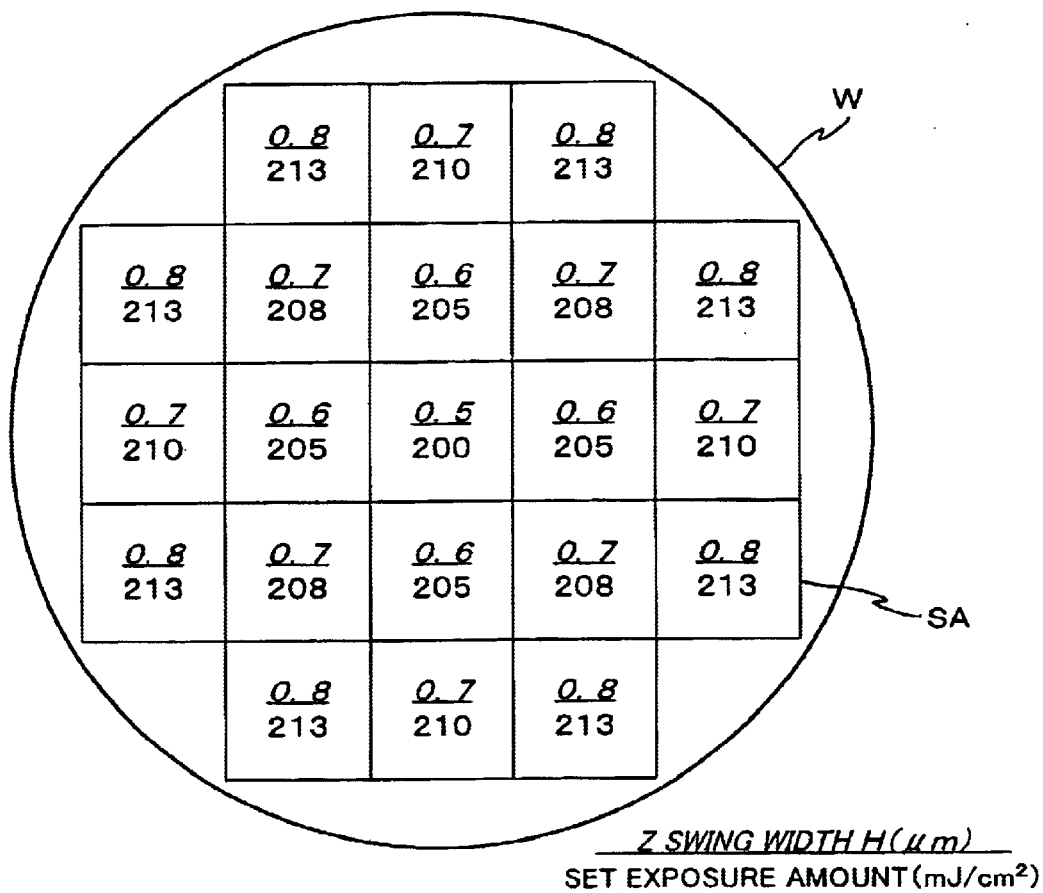
FIG. 6A is a view visually showing an example of how Z swing widths and set exposure amounts are set for the respective shot areas on a wafer W.
Figure 6B:
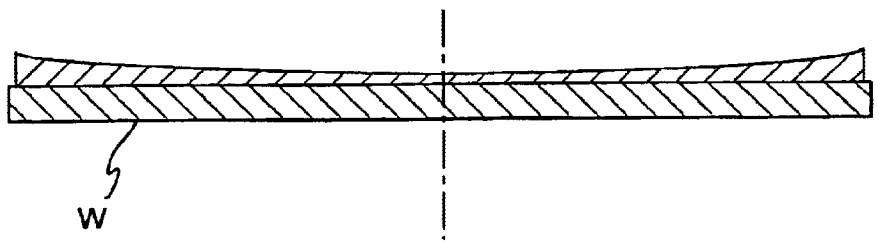
FIG. 6B is a sectional view of the wafer and a resist layer on which the settings in FIG. 6A are made.

FIG. 6A shows an example of the Z swing width H (upper position) and set exposure amount (target integrated exposure amount) for each shot area SA on the wafer W, on which the above scanning exposure is based and which is part of the above process program file corresponding to the resist layer thickness distribution shown in FIG. 6B.

As shown in FIG. 6A, in accordance with the thickness of the resist layer (the position of each shot area on the wafer W), the Z swing width H and set exposure amount decrease as the resist layer thickness in shot areas decreases, and vice versa.

A reticle loader and wafer loader (not shown) load a reticle and wafer under the control of the main controller 50. The main controller 50 then performs preparatory operation such as reticle alignment and baseline measurement (measurement of the distance from the detection center of an alignment detection system to the optical axis of the projection optical system PL) by using a reticle microscope, a reference mark plate on the wafer stage WST, off-axis alignment detection system (neither is shown), and the like in accordance with a predetermined procedure.

Thereafter, the main controller 50 executes alignment measurement for the wafer W such as EGA (Enhanced Global Alignment) by using the alignment detection system (not shown). After the alignment measurement, the patterns IR on the reticle R are transferred onto the respective shot areas SA on the wafer W by the step-and-scan method in the following manner.

In exposure operation, the wafer stage WST is moved to make the X-Y position of the wafer W coincide with the scanning start position for exposure on the first shot area (first shot) on the wafer W. At the same time, the reticle stage RST is moved to make the X-Y position of the reticle R coincide with the scanning start position. The main controller 50 then performs scanning exposure by synchronously moving the reticle R (reticle stage RST) and wafer W along the scanning direction on the basis of the position information of the wafer W measured by the laser interferometer 54W and the position information of the reticle R measured by the reticle laser interferometer 54R. In this scanning exposure, the main controller 50 performs exposure by the progressive focus exposure method described above with the Z swing width H and target integrated exposure amount corresponding to the first shot on the basis of the process program file in the RAM.

In this case, for example, the main controller 50 sets the Z swing width H by adjusting the tilt angle θ of the exposure area IA of the wafer W on the basis of the measurement value obtained by the focus detection system 19. Note that if the width D of the exposure area IA in the scanning direction can be adjusted, the Z swing width H may be set by adjusting the width D, or these two values may be adjusted. When the width D is to be changed, however, a target integrated exposure amount is preferably supplied to the wafer W upon changing at least one of values other than the width D, e.g., the scanning speed, pulse intensity, and repetition frequency (oscillation frequency).

The integrated exposure amount is adjusted by controlling at least one of the repetition frequency of pulses from the light source 16, scanning speed, and average pulse energy density indirectly obtained from an output from the integrator sensor 46, or, if the width D of the exposure area IA in the scanning direction can be adjusted, at least one of the width D, repetition frequency, scanning speed, and average pulse energy density.

When the transfer of a pattern onto one shot area is completed, the wafer stage WST is stepped by one shot area, and scanning exposure on the next shot area is then performed with the Z swing width H and target integrated exposure amount on the basis of the process program file.

In this manner, stepping and scanning exposure are sequentially repeated to transfer patterns corresponding to the number of shots required onto the wafer W. In this case, as described above, the Z swing width H and set exposure amount are adjusted in accordance with the thickness of the resist layer (the position of each shot area SA on the wafer W); these values are reduced as the resist layer thickness in shot areas decreases, and vice versa. This makes it possible to suppress variations in the shapes of patterns transferred onto the respective shot areas.

As has been described above in detail, according to the exposure apparatus 10 and exposure method according to this embodiment, when the pattern IR formed on the reticle R is projected on the wafer W, and an image of the pattern is transferred/formed on the wafer W by using the above progressive focus exposure method, the distribution of exposure amounts (energy amounts) on the wafer W with respect to each position on the surface of the wafer W with datum to the best imaging plane BF is changed by changing the Z swing width H in the above progressive focus exposure in accordance with the position of the shot area SA subject to exposure on the wafer W. This makes it possible to substantially increase the depth of focus of the projection optical system PL in accordance with the distribution information about variations in the thickness of the resist layer on the wafer W, which is obtained in advance, and to suppress variations in the shapes of pattern images depending on the positions of the shot areas SA on the wafer W.

Figure 2B:
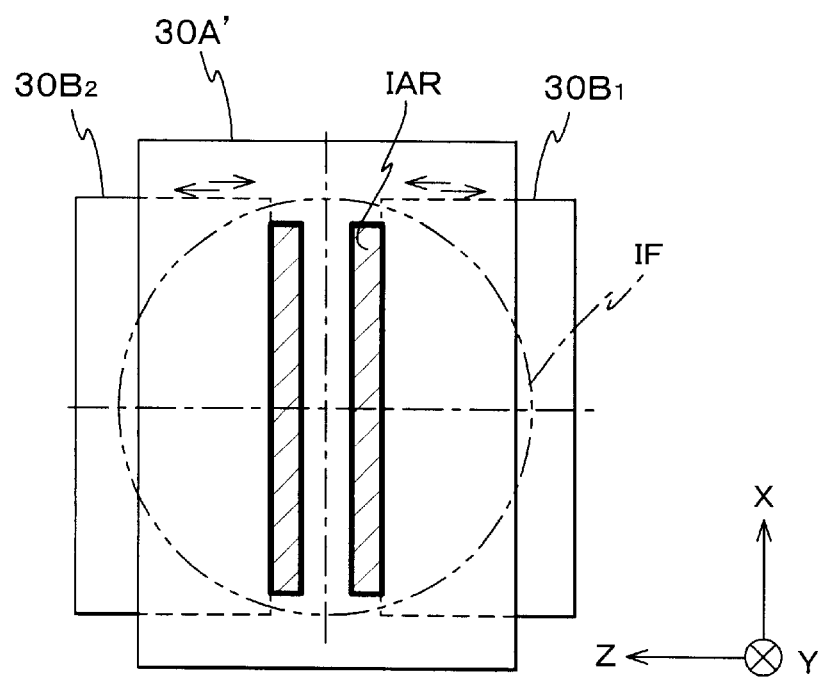
FIG. 2B is a view showing a modification of the fixed reticle blind.

When the fixed reticle blind 30A' shown in FIG. 2B is to be used, the above distribution of energy amounts corresponding to the position of each shot area on the wafer W can have peaks at two points (two portions) located near the two end portions of the Z swing width range on the surface of the wafer W with datum to the imaging plane while a predetermined integrated exposure amount (integrated energy) is supplied to each point on the wafer W (see FIG. 5A). In this case, the depth of focus of the projection optical system PL can be substantially increased, and the intensity distribution curve of energy supplied to each point in the exposure area IA can be made to have a sharp peak (see FIG. 5C). This can increase the resolution of a pattern image.

In this embodiment, in accordance with the position of the shot area SA on the wafer W, the integrated exposure amount (integrated energy amount) supplied into the shot area SA is changed as well as the Z swing width H, i.e., the distribution of energy amounts on the wafer W with respect to the position (Z position) of the surface of the wafer W in the optical axis direction of the projection optical system PL. This makes it possible to reduce the influences of variations in resister layer thickness depending on positions on the wafer W more effectively. In this embodiment, as described above, the distribution of energy amounts on the wafer W with respect to the position (Z position) of the surface of the wafer W in the optical axis direction of the projection optical system PL and the integrated exposure amount (integrated energy amount) in the shot area SA are changed for each shot area. As a precondition for this operation, a process program file is generated on the basis of the relationship between the position (distance) from the rotation center of the wafer W and the thickness of a resist layer, exposure conditions (e.g., information associated with illumination conditions and a reticle), and the like, and exposure is performed in accordance with the process program file. Therefore, a proper integrated exposure amount can always be supplied to each point on the wafer W.

However, the present invention is not limited to this; only one of the integrated exposure amount and the distribution of energy amounts supplied onto the wafer W with respect to the position (Z position) of the surface of the wafer W in the optical axis direction of the projection optical system PL may be changed in accordance with the position of the shot area SA on the wafer W. In each case, the depth of focus of the projection optical system PL can be substantially increased by the progressive focus exposure method. In addition, variations in the shapes of pattern images formed on the wafer W depending on the positions can be suppressed by changing the integrated exposure amount or the distribution of energy amounts supplied onto the wafer W with respect to the position (Z position) of the surface of the wafer W in the optical axis direction of the projection optical system PL in accordance with the position of each shot area on the wafer W. In this case as well, a proper integrated exposure amount is preferably supplied to each point on the wafer W by a technique similar to that described above.

The above embodiment has exemplified the case wherein the distribution of energy amounts and integrated exposure amount are changed for each shot area on the wafer W. However, the present invention is not limited to this; at least one of the distribution of energy amounts and integrated exposure amount may be changed for each position of the exposure area IA on the wafer W which is irradiated with the exposure light EL through the projection optical system PL, e.g., within one shot area on the wafer W, in accordance with its position. In this case, the distribution of resist layer thicknesses in each shot area is preferably obtained in advance, and the Z swing width H and set exposure amount are preferably set in a process program file in advance in accordance with the obtained distribution.

The above embodiment has exemplified the case wherein the double-slit-like fixed reticle blind is used to increase the resolution of each image formed on the wafer W. However, the present invention is not limited to this; a fixed reticle blind having three or more opening portions may be used. In this case, the moving speed of the X-Y stage can be increased as compared with the case wherein the double-slit-like fixed reticle blind is used.

In addition, when a fixed reticle blind having a rectangular opening like the one shown in FIG. 2A is to be used, the same effect as that obtained when the above double-slit-like fixed reticle blind or fixed reticle blind having three or more opening portions is used can be obtained by using a light-shielding portion having a size and shape corresponding to an area to be shielded, which is placed at a position almost conjugate to the circuit pattern IR in the optical path.

Second Embodiment

The second embodiment of the present invention will be described next with reference to FIGS. 6A to 8. The same reference numerals as in the first embodiment denote the same or equivalent parts in the second embodiment, and a description thereof will be simplified or omitted.

The arrangement and the like of an exposure apparatus according to the second embodiment are the same as those of the first embodiment. In the second embodiment, exposure is performed to transfer the patterns formed on a reticle R onto the respective shot areas on a wafer W by the step-and-scan method as in the first embodiment described above. In this operation, as in the first embodiment, a main controller 50 performs progressive focus exposure under conditions of a Z swing width H and target integrated exposure amount for each shot area SA, as shown in FIG. 6A on the basis of a process program file.

The exposure apparatus according to the second embodiment differs from the apparatus according to the first embodiment in the method of controlling a Z tilt stage 58 in scanning exposure (progressive focus exposure) by using the main controller 50. This embodiment will therefore be described below with particular emphasis on this point.

Figure 7A:
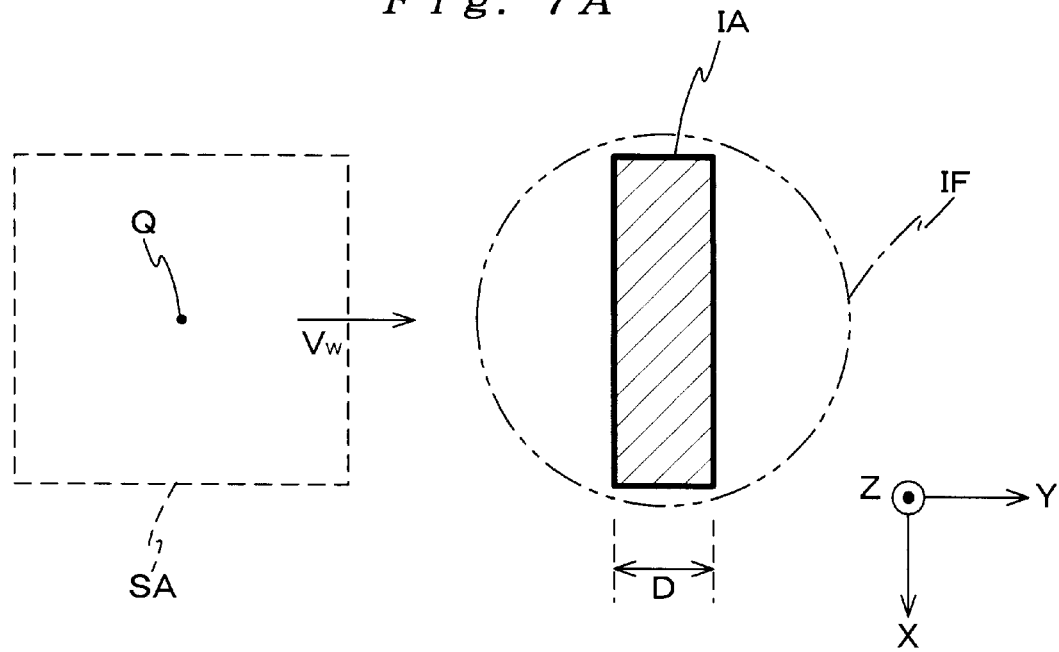
FIGS. 7A to 7C are views for explaining an exposure method according to the second embodiment of the present invention.

FIG. 7A shows how a wafer W is scanned relative to an exposure area IA as a projection area of an illumination area IAR on a reticle R in scanning exposure in the second embodiment. As shown in FIG. 7A, letting $V_W$ be the scanning speed of the wafer W in scanning exposure, and D be the width of the exposure area IA in the scanning direction, a time $T_0$ required for the wafer W to move by the width D in the Y-axis direction (scanning direction) (the time required for one point Q in a shot area on the wafer W to move by the distance D) is given by $$T_0 = D/V_W \tag{1}$$

Figure 7B:
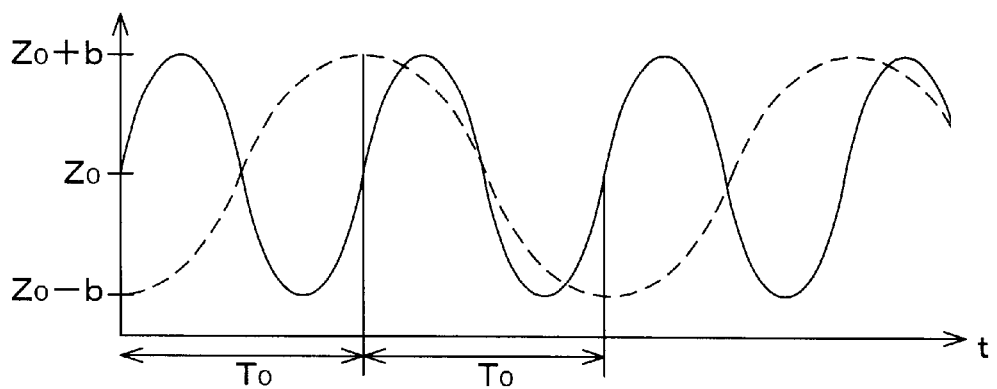

In scanning the shot area SA on the wafer W with respect to the exposure area IA, the main controller 50 periodically vibrates the exposure surface (surface) of the wafer W through the Z tilt stage 58 for the time To during which the point Q in the shot area SA on the wafer W passes through the exposure area IA. FIG. 7B shows how a Z-axis-direction position Z of the exposure surface of the wafer W changes with a time t. Referring to FIG. 7B, a position $Z_0$ is the position of the imaging plane of the projection optical system PL. As is apparent from a curve L1 indicated by the solid line in FIG. 7B, the Z-axis-direction position Z of the exposure surface of the wafer W changes in the form of a sine wave between a position ($Z_0+b$) and a position ($Z_0-b$) at a predetermined period $T=T_0$. Z swing width H=2b is set in accordance with an original depth of focus $\Delta Z$ of the projection optical system PL and the resist layer thickness in each shot area portion (see FIG. 6A). In this case, the initial position of the exposure surface of the wafer W in the Z-axis direction, i.e., the position Z at the start of movement in the Z-axis direction, may be arbitrarily set between the position ($Z_0+b$) and the position ($Z_0-b$).

In this case, when the exposure surface of the wafer W moves from the position ($Z_0-b$) to the position ($Z_0+b$) and from the position ($Z_0+b$) to the position ($Z_0-b$), the main controller 50 controls the Z tilt stage 58 such that a curve representing changes in a velocity $V_z$ of the Z tilt stage 58 in the Z-axis direction with respect to the Z position changes in the form of an isosceles trapezoid constituted by an acceleration region, constant velocity region, and deceleration region. In this embodiment, therefore, a light source 16 must perform pulse emission in synchronism with scanning of the wafer W and reticle R. However, it suffices to only perform velocity control with the above velocity characteristics in moving the Z tilt stage 58 in the Z-axis direction.

In this case, while a given exposure point Q in the shot area SA on the wafer W in FIG. 7A crosses the exposure area IA with the width D, the Z position of the exposure point Q reciprocates once between the position ($Z_0+b$) and the position ($Z_0-b$). While the exposure point Q crosses the exposure area IA with the width D, the light source 16 in FIG. 1 emits m (m is an integer equal to or larger than the number of minimum exposure pulses) ultraviolet pulse beams at an almost constant period, and an image of a pattern identical to one on the reticle R in FIG. 1 is projected onto the exposure point Q. Therefore, the distribution of exposure energy E(Z) at the exposure point Q with respect to the position Z exhibits a distribution curve M1 indicated by the solid line in FIG. 8; the exposure energy at the position ($Z_0-b$) and the position ($Z_0+b$) becomes high.

Likewise, while an arbitrary exposure point other than the exposure point Q in the shot area SA on the wafer W crosses the exposure area IA with the width D, the Z position of the exposure point reciprocates once between the position ($Z_0+b$) and the position ($Z_0-b$) Consequently, according to the distribution of exposure energy at the arbitrary exposure point, the exposure energy becomes high at the position ($Z_0-b$) and the position ($Z_0+b$), resulting in a substantial increase in the depth of focus of the projection optical system PL. Even if, therefore, the wafer W has projections and recesses, patterns can be transferred onto both the projection portion and the recess portion with the same precision. In this case as well, the effect of increasing the depth of focus is enhanced especially when isolated patterns such as contact hole patterns are projected/exposed on the wafer W.

In this embodiment, in general, a period $T_n$ (n is an integer equal to or larger than 1) of vibrations of the exposure surface of the wafer W in the Z-axis direction is preferably set to 1/n of the time $T_0$ required for an arbitrary point on the wafer W to crosses the exposure area with the width D in the Y-axis direction. That is, by using the scanning velocity $V_W$ of the wafer W and the width D of the exposure area IA, the period $T_n$ is given by $$T_n = T_0/n = D/(n \cdot V_W) \quad (2)$$

Figure 7C:
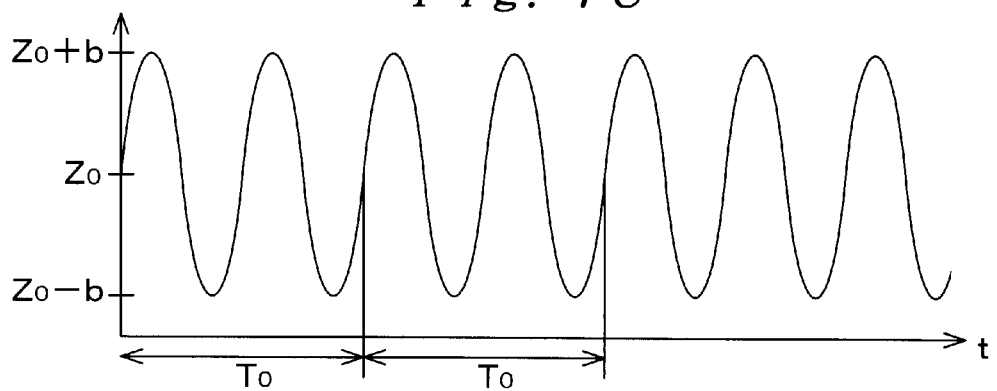
Figure 8:
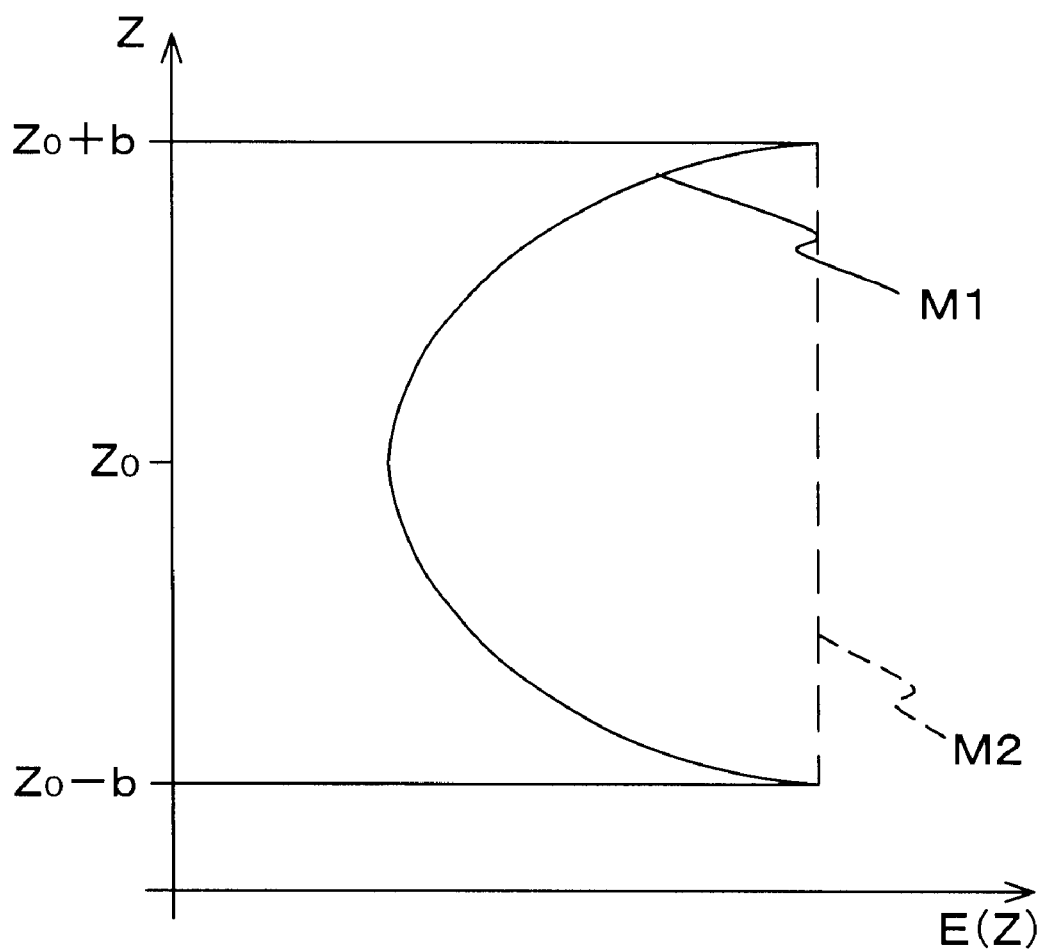
FIG. 8 is a view showing the distribution of exposure amounts (energy amounts) at an arbitrary position on a wafer in the optical axis direction in the exposure method according to the second embodiment.

FIG. 7C shows how the Z-axis-direction position Z of the wafer W changes with a time t when n=2 in another example of satisfying the condition given by equation (2) above. In this case, while an arbitrary exposure point in the shot area SA on the wafer W crosses the exposure area IA with the width D in the Y-axis direction, the Z position reciprocates twice between the position ($Z_0+b$) and the position ($Z_0-b$). In this case as well, therefore, the exposure energy at the arbitrary exposure point has a distribution like the one shown in FIG. 8, thus increasing the depth of focus.

Although the condition given by equation (2) is not satisfied, the exposure surface of the wafer W may be periodically vibrated with respect to the imaging plane of the projection optical system PL in the Z-axis direction at a period twice the time $T_0$ required for an arbitrary point on the wafer W to cross the exposure area IA with the width D in the X-axis direction, as indicated by the dashed line in FIG. 7B. In this case as well, while an arbitrary exposure point in a shot area on the wafer W crosses the exposure area IA with the width D in the Y-axis direction, the Z position moves between the position ($Z_0+b$) and the position ($Z_0-b$). Consequently, the depth of focus can be increased.

The distribution of exposure energy E(Z) with respect to the Z position may be set such that almost constant values appear between the position ($Z_0+b$) and the position ($Z_0-b$).

In the above manner, in the second embodiment, the progressive focus exposure method is executed in scanning exposure operation for each shot area SA on the wafer W. As described above, however, the main controller 50 must change the Z swing width H (=2b) and integrated exposure amount for each shot area on the basis of a process program file. For this reason, in vibrating the Z tilt stage 58 described above, the main controller 50 changes the Z swing width H in accordance with the position of the shot area SA on the wafer W by changing the control state of a velocity $V_Z$ in the Z-axis direction (changing one of the acceleration, deceleration, and velocity) such that a curve representing changes in the velocity $V_Z$ with respect to the Z position is formed into a different isosceles trapezoid. That is, the Z swing width H is changed by controlling the velocity $V_Z$ of the Z tilt stage 58 in the Z-axis direction. This makes it possible to change the distribution of energy amounts supplied onto the wafer W with respect to the position of the exposure surface of the wafer W with datum to the imaging plane (best imaging plane) of the projection optical system PL in accordance with the position of each shot area on the wafer W.

The main controller 50 also changes the integrated exposure amount supplied to each shot area in the same manner as described in the first embodiment.

As described above, according to the exposure apparatus and exposure method according to the second embodiment, the same effects as those of the first embodiment described above can be obtained.

The second embodiment has exemplified the case wherein the surface of the wafer W is driven in the optical axis direction with respect to the best imaging plane of the projection optical system PL in the form of a sine wave. However, the present invention is not limited to this; for example, the wafer surface may be vibrated in the form of a triangular wave. In this case, since the distribution of energy amounts at an arbitrary point on the wafer becomes similar to the curve M1 in FIG. 8, the depth of focus can be substantially increased.

In the second embodiment as well, at least one of the distribution of energy amounts and integrated exposure amount may be changed for each position of the exposure area IA on the wafer W, which is irradiated with exposure light EL through the projection optical system PL, in, for example, one shot area on the wafer W in accordance with its position. In this case, the distribution of resist layer thicknesses in each shot area may be obtained in advance, and the Z swing width H and set exposure amount may be set in a process program file in advance in accordance with the obtained distribution.

In the second embodiment as well, only one of the integrated exposure amount and the distribution of energy amounts supplied onto the wafer W with respect to the position (Z position) of the surface of the wafer W in the optical axis direction of the projection optical system PL may be changed in accordance with the position of the shot area SA on the wafer W.

The first and second embodiments have exemplified the case wherein when progressive focus exposure method is executed, the positional relationship between the imaging plane of the projection optical system PL and the surface of the wafer W is changed by moving the wafer W in the optical axis direction (Z-axis direction) of the projection optical system PL. However, the present invention is not limited to this. For example, the position of the exposure surface of the wafer W is fixed, and the position of the imaging plane of the projection optical system PL itself may be changed. In this case, a moving mechanism for a lens element $61_1$ incorporated in the projection optical system PL may be used. Alternatively, a sealed chamber may be set in the projection optical system PL, and the positional relationship between the imaging plane of the projection optical system PL and the surface of the wafer W may be changed by adjusting the pressure in the sealed chamber. In this case as well, the same effects as those in the above embodiment can be obtained.

In addition, when using the two-sided telecentric projection optical system PL like the one in each embodiment described above, the positional relationship between the imaging plane of the projection optical system PL and the surface of the wafer W may be changed by finely driving the reticle R in the direction of an optical axis AX. Alternatively, the positional relationship between the imaging plane and the surface of the wafer W may be changed by shifting the center wavelength of the exposure light EL or using at least two of these methods. When the center wavelength of the exposure light EL is shifted, the imaging characteristics (projection magnification, focal position, aberration, and the like) of the projection optical system PL change. For this reason, fluctuations in imaging characteristics are preferably corrected by moving at least one optical element of the projection optical system PL as needed (for example, when the change amount exceeds a predetermined allowable value).

The first and second embodiments have exemplified the case wherein the distribution of energy amounts supplied onto the wafer W with respect to the position of the exposure surface of the wafer W with datum to the imaging plane (best imaging plane) of the projection optical system PL is changed in accordance with the position of each shot area on the wafer W by changing the Z swing width H. However, the present invention is not limited to this. For example, the distribution of energy amounts may be changed in accordance with the position of each shot area on the wafer W by properly controlling the speed of the Z tilt stage 58 (wafer W) in the direction of the optical axis AX while keeping the Z swing width H constant.

Each embodiment described above has exemplified the case wherein the present invention is applied to a scanning stepper. However, the application range of the present invention is not limited to this and can be suitably applied to a static exposure apparatus such as a stepper. When the present invention is to be applied to such a stepper, for example, the distribution of energy amounts (e.g., Z swing width or moving speed) for each shot area in the direction of the optical axis AX may e changed by using the progressive focus exposure method disclosed in U.S. Pat. No. 5,483,311. In addition, when the integrated exposure amount is to be changed for each shot area, for example, at least one of the image surface illuminance (the intensity of the exposure light EL) and exposure time (the number of exposure pulses) may be changed. Note that the disclosure in the above reference is incorporated in the specification of the present invention.

Third Embodiment

The third embodiment of the present invention will be described next with reference to FIGS. 9 to 15B.

Figure 9:
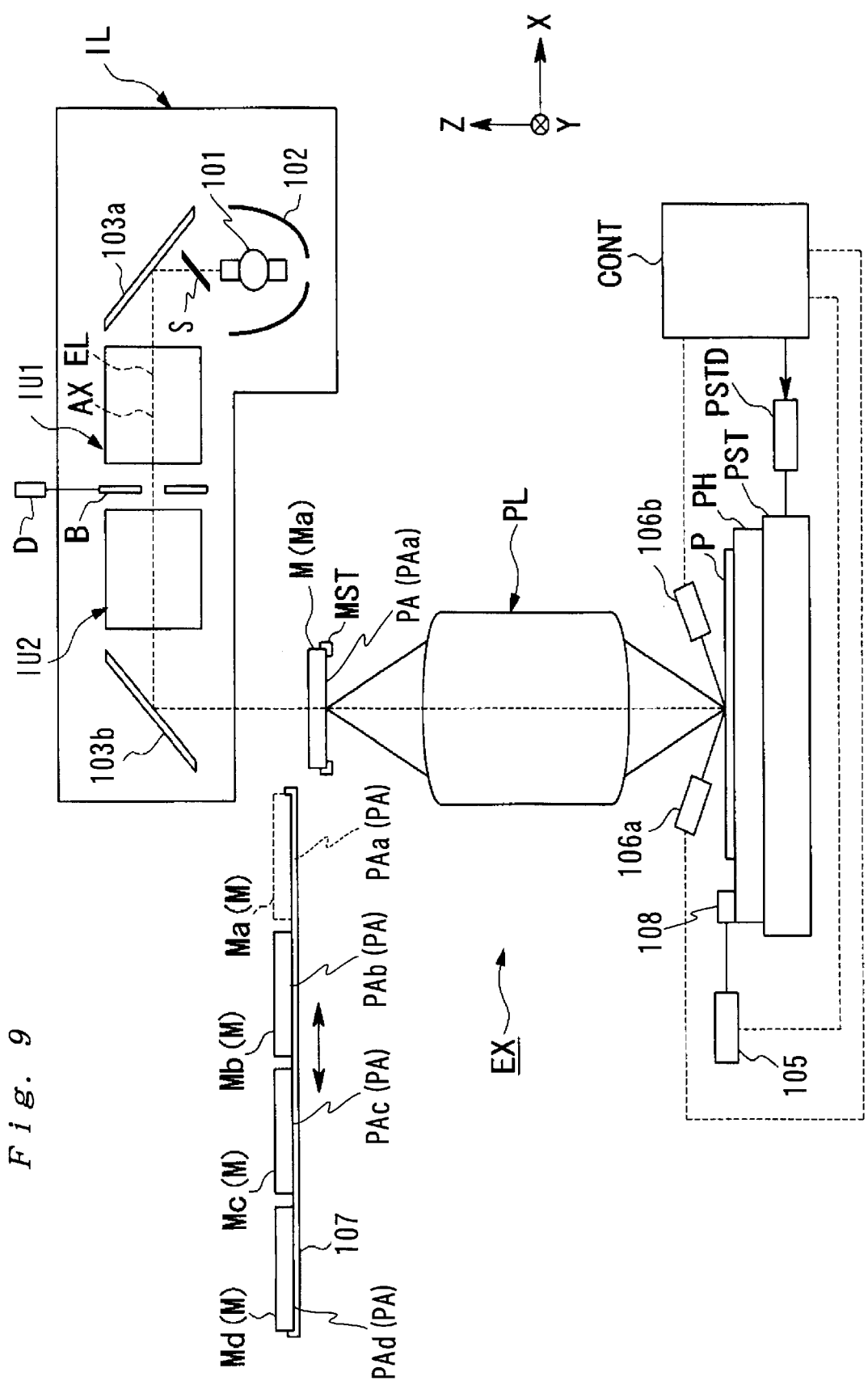
FIG. 9 is a view showing the schematic arrangement of an exposure apparatus according to the third embodiment of the present invention.
Figure 11A:
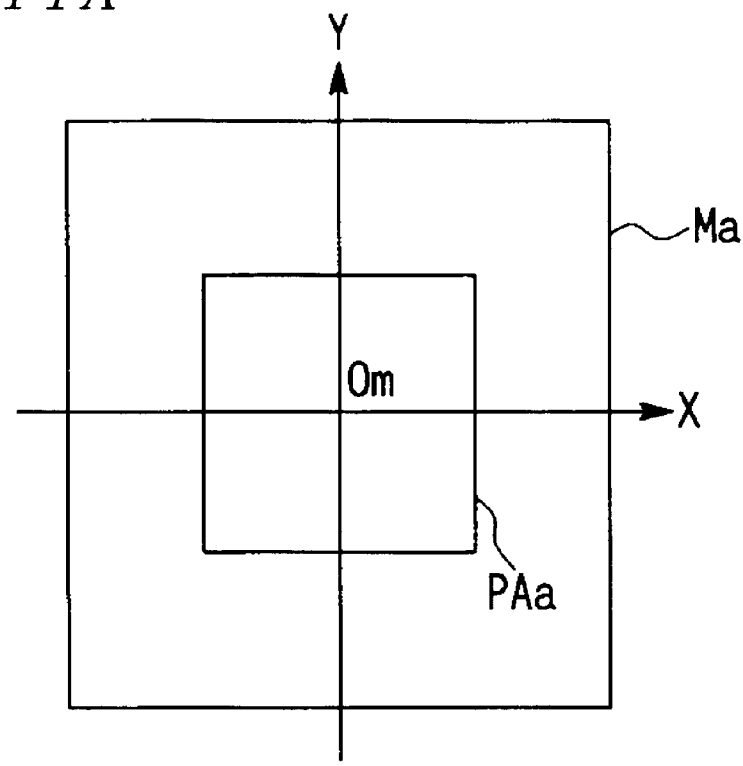
FIGS. 11A and 11B are views each showing an example of the arrangement of a pattern formed on a mask in the third embodiment.
Figure 11B:
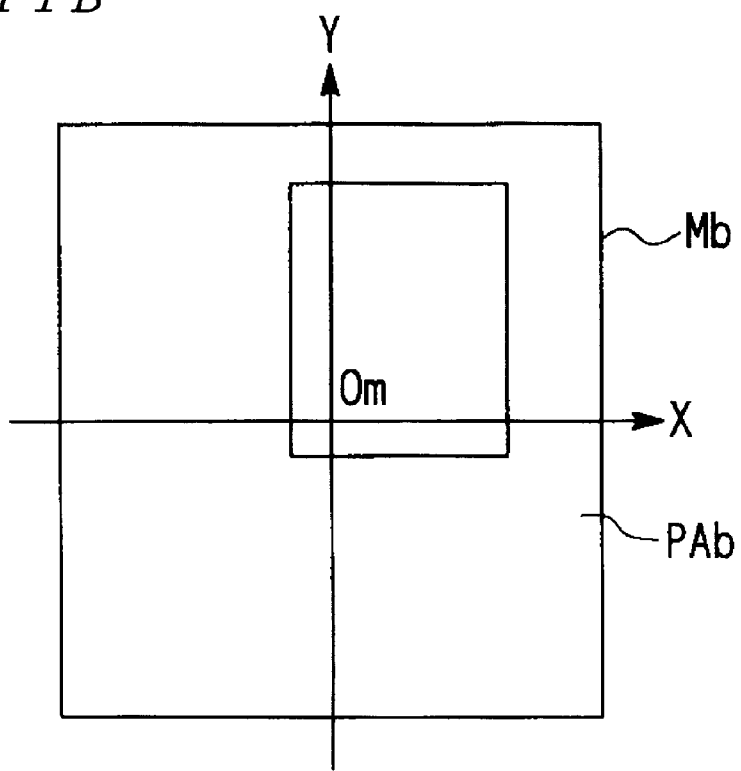

FIG. 9 schematically shows the arrangement of an exposure apparatus according to the third embodiment. An exposure apparatus EX shown in FIG. 9 is a step-and-repeat type projection exposure apparatus for manufacturing liquid crystal display devices, i.e., a so-called liquid crystal stepper.

As shown in FIG. 9, the exposure apparatus EX includes an illumination system IL including a light source, a mask stage MST for holding masks M (Ma to Md), a projection optical system PL, a plate stage PST serving as a substrate stage for holding a glass plate P (to be referred to as a plate P hereinafter) as a substrate, a control system for them, etc.

The illumination system IL includes an ultra-high pressure mercury lamp 101 serving as a light source, an elliptic mirror 102, a shutter S, a first optical unit IU1, a blind portion B, a second optical unit IU2, optical path bending mirrors (return mirrors) 103a and 103b, and the like.

The first optical unit IU1 incorporates a wavelength selection element, an input lens, a fly-eye lens or rod type (internal reflection type) integrator serving as an optical integrator, a first relay lens, and the like (none of which are shown). The second optical unit IU2 incorporates a second relay lens constituting a relay optical system, together with the first relay lens, a condenser lens, etc., (none of which are shown).

The function of each component of the illumination system IL will be briefly described below. Light emitted from the ultra-high pressure mercury lamp 101 is focused by the elliptic mirror 102 onto its second focal point. When the shutter S is open, the light is reflected by the optical path bending mirror 103a. The light reflected by this optical path bending mirror 103a enters the first optical unit IU1. In the first optical unit IU1, light having an exposure wavelength, e.g., one of a g line (436 nm), h line (405 nm), i line (365 nm), and the like, is selected by the wavelength selection element (wavelength filter, not shown). The selected light is then incident as the exposure light EL onto the optical integrator through the input lens. This exposure light EL is made uniform in illuminance by the optical integrator and illuminates the blind portion B through the first relay lens with a uniform illuminance. The exposure light EL passing through the opening of the blind portion B sequentially passes through the second relay lens and condenser lens in the second optical unit IU2. The optical path is then bent vertically downward by the optical path bending mirror 103b. The resultant light illuminates that area of the pattern area on a mask M, on which a pattern PA is formed, which is defined by the opening of the blind portion B with a uniform illuminance.

In the third embodiment, as the masks M, four masks Ma to Md on which different patterns PAa to PAd are formed, and a mask changer 107 on which these four masks Ma to Md can be mounted is provided. As shown in FIG. 9, the mask changer 107 is movably disposed above the mask stage MST. The masks Ma to Md can be loaded onto the mask stage MST and can be unloaded therefrom. That is, the mask changer 107 selectively mounts the masks Ma to Md on the mask stage MST and interchanges the masks, as needed.

The mask M to be mounted on the mask changer 107 is stored in a mask library (not shown). A mask is loaded from the mask library onto the mask changer 107 in the following manner. First of all, a loader (transfer unit, not shown) extracts the mask M from the mask library and temporarily loads it on the mask stage MST. The mask changer 107 receives the mask M from the mask stage MST. The mask M is then loaded on the mask changer 107. The mask M mounted on the mask changer 107 is returned into the mask library in the following manner. The mask changer 107 temporarily loads the mask M on the mask stage MST. The loader (not shown) then returns the mask M from the mask stage MST into the mask library. Note that a mask transfer system including a mask changer is disclosed in detail in Japanese Patent Laid-Open No. 8-250410 or the like, and the disclosure in this reference is incorporated in the specification of the present invention.

The mask stage MST is configured to be slightly driven in the two-dimensional directions (X and Y directions) and holds the masks M (Ma to Md) by suction through a vacuum chuck (not shown).

As the projection optical system PL, for example, a two-sided telecentric refraction optical system constituted by a plurality of lenses (optical elements) is used. The optical axis direction of this projection optical system PL coincides with the Z-axis direction. The projection magnification of the projection optical system PL is set to, for example, 1. For this reason, as described above, when the mask M is illuminated by the illumination system IL, exposure light EL (imaging light beam) transmitted through the mask M strikes the projection optical system PL, and then strikes the plate P through the projection optical system PL. As a consequence, a one-to-one image of a pattern on the mask M is formed on the surface of the plate P.

In practice, the plate stage PST includes an X-Y stage that can freely move within the X-Y plane, a Z/leveling stage that is mounted on the X-Y stage and can be finely driven in the Z-axis direction and the tilting direction with respect to the X-Y plane, and a θ stage that is mounted on the Z/leveling stage and can be finely rotated around the Z-axis. FIG. 9 representatively shows these stages as the plate stage PST. Assume that in the following description, the plate stage PST is the single stage that can move six-degree-of-freedom directions X, Y, Z, θx, θy, and θz.

A plate holder PH serving as a substrate holder is mounted on the upper surface of the plate stage PST (to be more precise, the θ stage), and the plate P is chucked/held on the plate holder PH. The surface of the plate P is coated with a photosensitive agent (photoresist).

The position of the plate stage PST within the X-Y plane is detected by a laser interferometer 105 through a movable mirror 108 fixed on the plate holder PH with, for example, a resolution of about 0.5 to 1 nm. The detection result obtained by the laser interferometer 105 is transmitted to a control unit CONT. The control unit CONT controls the movement stage (position, speed, and the like) of the plate stage PST through a driving mechanism PSTD on the basis of the detection result from the laser interferometer 105.

This exposure apparatus EX also includes a focus position detection system having a light-emitting system 106a and light-receiving system 106b which detect the position (focus position) of the surface (exposure surface) of the plate P, held on the plate holder PH, in the optical axis direction of the projection optical system PL. As this focus position detection system (106a, 106b), a multi-focal position detection system similar to the one in the first embodiment described above is used. The position information detected by this focus position detection system (106a, 106b) is output to the control unit CONT. In performing exposure processing, the control unit CONT performs focus/leveling control on the plate stage PST through the driving mechanism PSTD on the basis of the detection result from the focus position detection system (106a, 106b) such that an exposure area on the surface of the plate P coincides with the imaging plane of the projection optical system PL (almost coincides with the range of the depth of focus of the projection optical system PL).

The control system is mainly formed by the control unit CONT formed by a microcomputer (or workstation). This control unit CONT systematically controls the overall apparatus as well as performing various types of control described above.

The exposure apparatus EX of this embodiment is configured to perform exposure apparatus EX by the step-and-repeat method of alternately repeating inter-shot stepping operation of sequentially positioning each shot area of the plate P to the exposure position immediately below the projection optical system PL, and exposure operation of transferring each pattern formed on the mask M onto a corresponding shot area on the plate P while keeping the mask M and plate P stationary at the corresponding positions.

In this case, as is obvious, the exposure apparatus EX can transfer a pattern formed on the same mask onto a plurality of shot areas on the plate P. However, in the following case to be described below, the patterns PAa to PAd on the different masks Ma to Md are transferred onto a plurality of shot areas on the same plate P, i.e., the patterns PAa to PAd are respectively transferred onto different areas on the plate P while the masks Ma to Md are interchanged.

For the sake of descriptive convenience, a case wherein the patterns PAa and PAb of the plurality patterns PAa to PAd are transferred onto the plate P will be described below.

Assume that data associated with exposure processing like that shown in FIG. 10 is registered in the RAM in the control unit CONT in advance, and the CPU (Central Processing Unit) of the control unit CONT performs exposure processing in accordance with the data. The data shown in FIG. 10 is part of a data file called a process program containing set data (including a shot map) for various exposure conditions.

The data shown in FIG. 10 will be described below. Referring to FIG. 10, the "pattern size" indicates the lengths (unit: $\mu m$) of the patterns PAa, PAb, . . . having rectangular shapes when viewed from the top and respectively formed on the masks Ma, Mb, . . . The "pattern position" indicates the X-Y coordinate positions (unit: $\mu m$) of the centers of the patterns PAa, PAb, . . . on the masks Ma, Mb, . . . with reference to centers (mask centers) Om of the masks Ma, Mb, . . . That is, the pattern sizes and pattern positions are set on the basis of a coordinate system (mask coordinate system) with reference to the centers Om of the masks Ma, Mb, . . . shown in FIGS. 11A and 11B.

Figure 12:
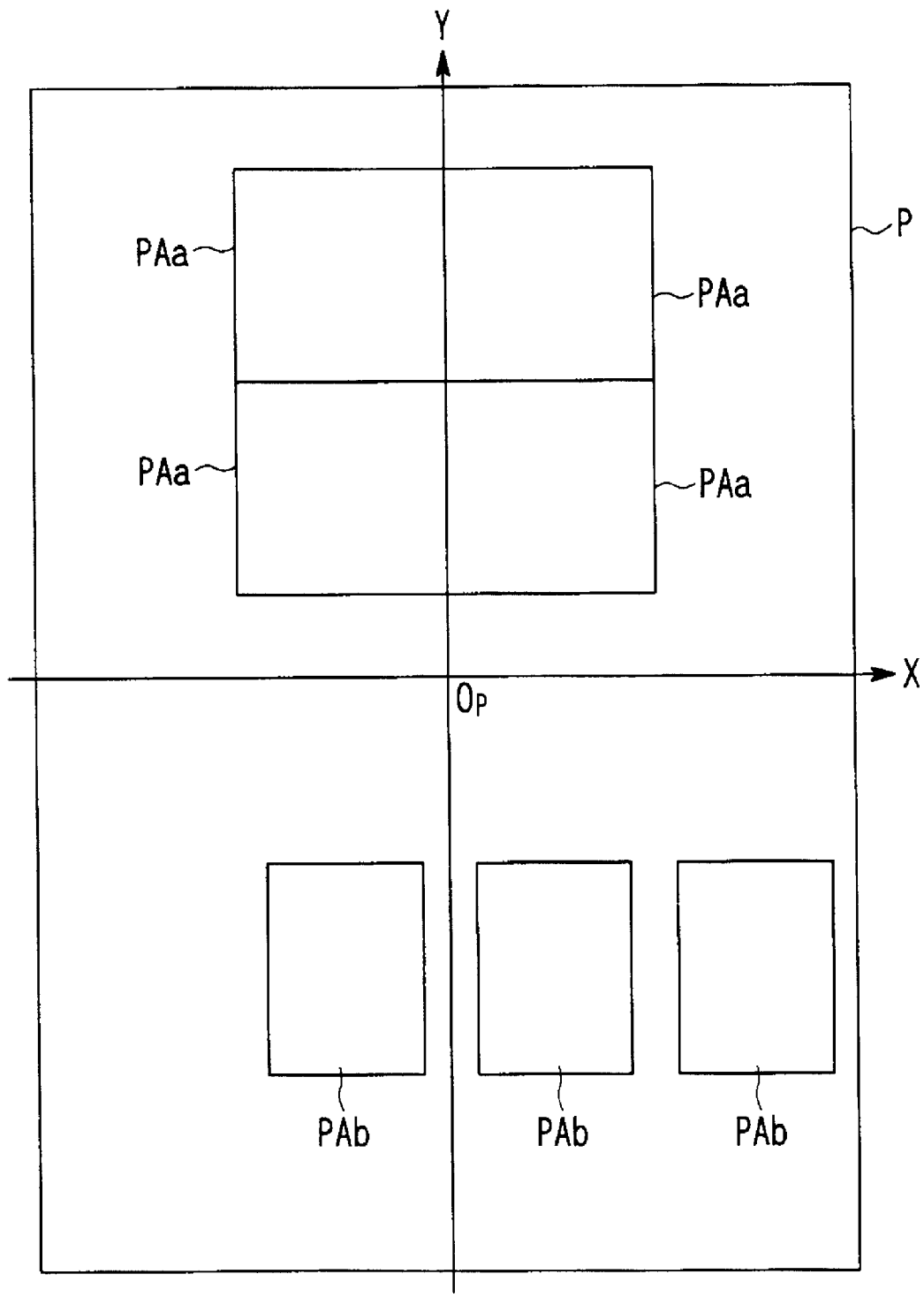
FIG. 12 is a view showing an example of the arrangement of patterns formed on a substrate in the third embodiment.

The "arrangement" in FIG. 10 indicates numeric values indicating how many patterns PAa and PAb are arranged on the plate P in the X and Y directions in a coordinate system (substrate coordinate system) with a center Op of the plate P in FIG. 12. The "arrangement pitch" indicates the distance (unit: $\mu$m) between the centers of the respective patterns when they are arranged in the substrate coordinate system. The "arrangement position" indicates the coordinate positions (unit: $\mu$m) of the centers of pattern arrangements with reference to the center Op when pluralities of the patterns PAa, PAb, . . . are arranged on the plate P.

Referring to FIG. 10, the "exposure energy" indicates the energy (unit: mJ) of exposure light used to transfer each of the patterns PAa, PAb, . . . onto the plate P. The "AF value" indicates the position (unit: $\mu$m) of the plate P with respect to the imaging plane of the projection optical system PL in the optical axis direction of the projection optical system PL. That is, this value indicates a focus offset in exposure operation. The "AF swing width" indicates the moving amount (unit: $\mu$m) by which the plate P is moved in the optical axis direction of the projection optical system PL during exposure. That is, this term is synonymous with the Z swing width described above. In this case, the center of the AF value swing width is set to the AF value. Letting "a" be the AF value and b be the AF value swing width, the surface (exposure surface) of the plate P is continuously moved within the range of (a−b/2) to (a+b/2) by moving the plate stage PST in the Z direction.

Each AF value is obtained in advance by experiment or an optical simulation. When an AF value is to be obtained by experiment, the imaging plane of the projection optical system PL is matched with the Z position of the exposure surface of the plate P on the basis of the detection result obtained by the focus position detection system (106$a$, 106$b$) while the mask M is mounted on the mask stage MST. In this state, test exposure is performed. The Z position of the plate P (the value obtained by the focus position detection system (106$a$, 106$b$)) at this time is set as a reference value for AF values.

Subsequently, the plate P having undergone exposure processing is developed, and the shape of the pattern that is actually formed is measured with, for example, a scanning electron microscope (SEM) or an FIA (Field Image Alignment) type alignment microscope if it is provided for the exposure apparatus EX. If a pattern shape having a desired precision cannot be obtained, test exposure and development are repeated while the Z position of the plate P is adjusted until a pattern shape with a desired precision is obtained. The position at which a desired pattern shape is obtained is set as an AF value. Therefore, for example, the AF value, 0.5 $\mu$m, of the pattern PAa in FIG. 10 is a deviation amount (focus offset) with datum to the reference value.

In this case, since the AF swing width is 2 $\mu$m, the plate P is continuously moved by the plate stage PST in the Z direction within the range of −0.5 to 1.5 $\mu$m, centering on an AF value of 0.5 $\mu$m. Note that the AF value swing width in this case as well is set in advance by experiment or the like in accordance with the pattern to be formed. When, for example, a pattern requiring a predetermined shape in the depth direction such as a contact hole pattern is to be formed, the depth of focus is substantially increased by swinging the AF value within a predetermined range, thus obtaining a desired shape. By setting this AF value swing width in accordance with the depth of focus of the projection optical system PL, for example, setting it within the depth of focus or outside the depth of focus by a predetermined amount, a pattern having a predetermined shape can be formed.

In this manner, an AF value and AF value swing width are set in accordance with the position of the imaging plane or depth of focus of the projection optical system PL.

Exposure energy (exposure dose) is set for each pattern in advance. This exposure energy is also set to the optimal value obtained in advance by experiment in accordance with a pattern. More specifically, as shown in FIG. 10, the exposure energy is set to 40 mJ in exposure operation using the pattern PAa, and to 50 mJ in exposure operation using the pattern PAb.

The position of the plate P with respect to the imaging plane of the projection optical system PL in the optical axis direction of the projection optical system PL and the moving amount (AF value swing width) of the plate P in the optical axis direction are set for each pattern on the basis of the data set in advance, which is shown in FIG. 10. Exposure processing is then performed to form transferred images of the patterns PAa and PAb on the plate P. More specifically, as shown in FIG. 12, the patterns PAa are formed in two columns and two rows with the size and position shown in FIG. 10, whereas the patterns PAb are formed in three columns and one row with the size and position shown in FIG. 10.

Figure 13:
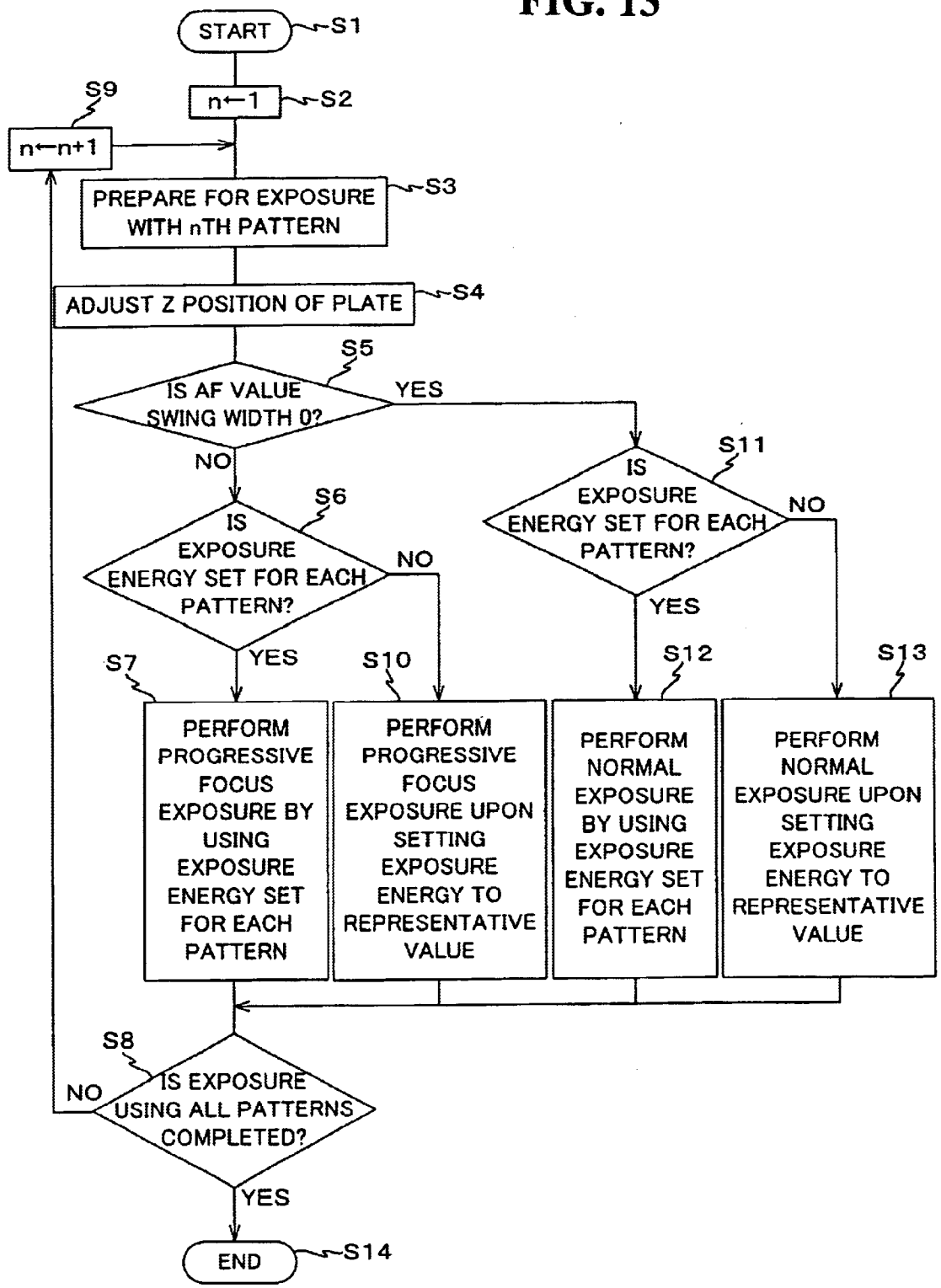
FIG. 13 is a flow chart for explaining an exposure method according to the third embodiment.

The flow of operation (procedure) of transferring a plurality of patterns onto the plate P on the basis of preset data like that shown in FIG. 10 will be described next with reference to the flow chart of FIG. 13, which shows the control algorithm executed by the CPU in the control unit CONT.

The control operation shown in this flow chart is started when the operator instructs the control unit CONT in the exposure apparatus to start exposure processing (step S1).

In step S2, the CPU sets the count value of a counter (not shown), which indicates the ordinal number of the pattern PA used in exposure, to an initial value of 1 (n←1).

In step S3, the CPU performs preparatory operation for exposure using the nth (first in this case) pattern. More specifically, the CPU searches for the table data (see FIG. 10) in the RAM to read and load various data for exposure conditions associated with the first pattern data (PAa) into the memory in the apparatus body in accordance with the process program. The CPU then determines that the pattern to be used for the first exposure operation is the pattern PAa, and loads the mask Ma on which the pattern PAa is formed (drawn) onto the mask stage MST through the mask changer 107. At the same time, the CPU drives the blind portion B through a blind driving unit D (see FIG. 9) in accordance with the pattern size of the pattern PAa, thus setting an illumination range for the mask Ma.

In step S4, the CPU recognizes that the AF value is 0.5 $\mu$m on the basis of the table data loaded into the memory in the apparatus body, and adjusts the position of the plate stage PST holding the plate P on the basis of this AF value. More specifically, the CPU sets the focus offset of the focus position detection system (106$a$, 106$b$) to +0.5 $\mu$m, and drives the plate stage PST through the substrate stage driving unit PSTD while monitoring the detection value obtained by the focus position detection system (106$a$, 106$b$), thereby setting the surface (exposure surface) of the plate P to a position of 0.5 $\mu$m with respect to the imaging plane of the projection optical system PL in the +Z direction.

In step S5, the CPU determines on the basis of the above table data whether the set AF value swing width is 0, thereby determining whether multi-focus exposure is performed. In this case, the AF value swing width for the pattern PAa is 2 $\mu$m ($\neq$0), as shown in FIG. 10. NO is therefore obtained in step S5, and hence the flow advances to step S6.

In step S6, the CPU determines whether an exposure energy is independently set for each pattern. In this case, as is obvious from FIG. 10, exposure energies are set for the respective patterns; 40 mJ is set for the pattern PAa, and 50 mJ for the pattern PAb. YES is therefore obtained in step S6, and the flow advances to step S7.

In step S7, exposure is performed in accordance with the set exposure conditions. More specifically, the progressive focus exposure method is executed by the step-and-repeat method using an AF value swing width of 2 μm with the set AF value of 0.5 μm being a central value in accordance with the set pattern position, arrangement pitch, and arrangement position while at least one of the output of the mercury lamp 101, the attenuation unit in the illumination optical system, and the exposure time (the time interval between the opening and closing of the shutter S) to set the exposure energy amount supplied to the shot area on the plate P to 40 mJ. During this series of exposure operations, the plate stage PST is moved through the substrate stage driving unit PSTD. In the above progressive focus exposure, various methods are available as methods of moving the plate stage PST, as described above. In this case, for example, the plate stage PST holding the plate P is continuously reciprocated in the optical axis direction of the projection optical system PL during irradiation of the plate with exposure light such that the speed of the stage changes in the form of a sine curve.

As a consequence, as shown in FIG. 12, the patterns PAa are transferred onto four places as shown in FIG. 10.

When the exposure processing with the first pattern PAa is completed in this manner, the CPU checks whether exposure processing with all patterns is completed (step S8). In this case, since only exposure with the pattern PAa is completed, NO is obtained in step S8, and the flow advances to step S9 to increment the count value of the counter (not shown), which indicates the ordinal number of the pattern PA to be used, by one (n←n+1). The flow then returns to step S3 to perform preparatory operation for exposure using the nth pattern, i.e., the second pattern PAb in this case. If the nth pattern belongs to the same mask as the preceding pattern, the same mask is used. If the pattern PAb is formed on the different mask Mb as in this embodiment, the mask (the mask Ma in this case) is unloaded from the mask stage MST, and the next mask (the mask Mb in this case) is loaded onto the mask stage MST. In addition, an opening for the blind portion B is set in accordance with the pattern PAb (step S3). Thereafter, the processing and determination in step S4 and the subsequent steps are repeated to transfer the patterns PAb onto three places, as shown in FIG. 12.

After the completion of the above exposure processing, the flow advances to step S8 to check whether exposure processing with all patterns is completed. If NO in step S8, the flow returns to step S9 to repeat processing and determination similar to those described above until exposure processing with all the patterns is completed.

If the exposure processing with all the patterns is completed, for example, exposure using the pattern PAb is completed, YES is obtained in step S8, and the series of operations in this routine are terminated (step S14).

If it is determined in step S6 that exposure energy is not independently set for each pattern, the flow advances to step S10. In step S10, to set the exposure energy to a preset representative value (predetermined value), for example, exposure energy applied while the shutter S is open is integrated, and the shutter S is closed when the integrate value becomes equal to a target exposure energy value (exposure dose). In this case, the CPU controls the substrate stage driving unit PSTD to move the plate stage PST in the optical axis direction of the projection optical system PL with an AF value swing width with the set AF value being set as a central value in accordance with the opening time of the shutter S. When this exposure processing is completed, the flow advances to step S8 to check whether exposure processing with all the patterns is completed, and processing and determination similar to those described above are repeated afterward.

In contrast to the above case, if the set AF value swing width is 0, the flow advances to step S11 to check whether exposure energy is independently set for each pattern. If exposure energy is independently set for each pattern, YES is obtained in step S11, and the flow advances to step S12 to perform exposure in accordance with the set exposure conditions. More specifically, the normal exposure method is executed by the step-and-repeat method with the set AF value in accordance with the set pattern position, arrangement pitch, and arrangement position while at least one of the output of the light source 101, the attenuation unit in the illumination optical system, and the exposure time (the time interval between the opening and closing of the shutter S) is adjusted to set the exposure energy amount supplied to the shot area on the plate P to a representative value. In this case, the position of the plate P on the plate stage PST is fixed during exposure.

When the exposure processing in the step S12 is completed, the flow advances to step S8 to check whether exposure processing with all the patterns is completed, and processing and determination similar to those described above are repeated.

If it is determined in step S11 that exposure energy is not independently set for each pattern, the flow advances to step S13 to control the opening time of the shutter S with the set AF value so as to set the exposure energy to a preset representative value (predetermined value). In this case as well, the position of the plate stage PST is fixed during exposure (step S13).

When the exposure processing in step S13 is completed, the flow advances to step S8 to repeat processing and determination similar to those described above.

In the above case, the two patterns PAa and PAb are exposed. As is obvious, however, if data about all the patterns PAa to PAd are registered, exposure processing for the patterns PAa to PAd can be performed on the basis of the registered data.

As described above, according to the third embodiment, when the plurality of patterns PAa to PAd are to be transferred onto one plate P, at least one of the position (AF value) of the plate P with respect to the imaging plane of the projection optical system PL in the optical axis direction of the projection optical system PL and the moving amount (AF value swing width) by which the position is moved during exposure is set every time each of the patterns PAa to PAd is transferred. For this reason, even if the patterns to be formed on the plate P by transferring these patterns PAa to PAd vary in target shape in the depth direction, exposure can be performed upon setting the focus position or depth of focus to an arbitrary value in accordance with a corresponding one of the patterns PAa to PAd. Therefore, the patterns formed on the plate after the transfer of all the patterns PAa to PAd can be formed into desired shapes with high precision.

With the recent demands for a reduction in pattern size, the numerical aperture (N.A.) of the projection optical system PL increases. With this tendency, the depth of focus decreases. For this reason, if exposure is performed with a constant target focus position and constant AF value swing width (Z swing width) regardless of the types of patterns, a pattern that does not require a predetermined shape in the depth direction, e.g., a line-and-space pattern, can be transferred with high precision, but a pattern that requires a predetermined shape in the depth direction, e.g., a contact hole pattern or a pixel pattern in a liquid crystal display device, may not have a desired shape in the depth direction. In contrast to this, in this embodiment, since the position and moving amount of the plate P in the optical axis direction of the projection optical system PL are set in accordance with the pattern to be formed, even if a projection optical system with a small depth of focus is used, a pattern having a desired shape in the depth direction can be formed with high precision owing to a substantial increase in depth of focus regardless of whether the pattern does not require a predetermined shape in the depth direction or requires a predetermined shape in the depth direction.

In the third embodiment, the control unit CONT continuously moves/controls the plate stage PST holding the plate P in the optical axis direction of the projection optical system PL during exposure. However, the present invention is not limited to this.

FIG. 14A shows table data, similar to that shown in FIG. 10 in the third embodiment, which is associated with exposure processing performed by using one pattern PA (e.g., PAa) while continuously moving/controlling the plate stage PST in the optical axis direction of the projection optical system PL. In this case, the exposure energy is set to 40 mJ; the AF value, 0 $\mu$m; and the AF value swing width, 8 $\mu$m. When exposure is to be performed on the basis of the data in FIG. 14A, the control unit CONT continuously moves the plate P within the range of −4 $\mu$m to +4 $\mu$m such that the moving speed of the projection optical system PL in the optical axis direction changes in the form of a sine curve.

FIG. 14B shows data associated with exposure processing performed when one pattern PA (PAa) is transferred while the plate stage PST is moved/controlled stepwise in the optical axis direction of the projection optical system PL. When exposure is to be performed on the basis of the data in FIG. 14B, the plate P is positioned twice with respect to the imaging plane of the projection optical system PL, and exposure (so-called FLEX exposure) is performed at the two resultant positions. In this case, in the first exposure operation, the exposure energy is set to 20 mJ; the AF value, +4 $\mu$m; and the AF value swing width, 0 $\mu$m (i.e., the plate P is not moved during exposure). In the second exposure operation, the exposure energy is set to 20 mJ; the AF value, −4 $\mu$m; and the AF value swing width, 0 $\mu$m (i.e., the plate P is not moved during exposure). Thus, exposure is performed twice (double exposure) with the respective AF values.

As described above, when exposure is to be performed while the plate P is moved in the optical axis direction of the projection optical system PL, exposure may be performed while the plate P is continuously moved. Alternatively, the plate P may be moved stepwise between a plurality of set AF values, and exposure may be performed at the respective positions. Note that when the plate P is to be moved stepwise, exposure light reaching the plate P is blocked by the shutter S or the like during movement.

Assume that the plurality of patterns PAa and PAb are to be transferred onto one plate P. In this case, when the pattern PAa is to be transferred, exposure may be performed while the plate P is continuously moved in the optical axis direction of the projection optical system PL. When the pattern PAb is to be transferred, exposure may be performed a plurality of number of times while the plate P is moved stepwise in the optical axis direction of the projection optical system PL.

When exposure is to be performed while the plate P is moved in the optical axis direction of the projection optical system PL, the shapes of patterns formed under the respective exposure conditions can be made uniform by setting higher exposure energy than when exposure is performed without moving the plate P (exposure is performed in a stationary state). This is because when the plate P is moved, a pattern image is defocused, i.e., blurred, to the extent corresponding to the movement; when exposure is performed while the plate P is moved, higher exposure energy is required to obtain the same pattern shape as that when exposure is performed without moving the plate P. Therefore, a pattern having a desired shape can be formed by selectively setting exposure energy depending on whether the plate P is to be moved in the optical axis direction or not.

The exposure energy in FIG. 14A is 40 mJ, whereas the exposure energy in FIG. 14B is set to 20 mJ and exposure is performed twice to match the total exposure energy with that shown in FIG. 14A. However, the exposure energy in FIG. 14A may be increased (for example, the exposure energy in FIG. 14A may be set to 41 mJ). That is, when exposure is to be performed once while the plate P is continuously moved, the exposure energy is set/changed to a higher level than when exposure is to be performed a plurality of number of times while the plate P is moved stepwise.

Likewise, when exposure is performed while the plate P is moved in the optical axis direction of the projection optical system PL, the exposure energy is preferably increased as the AF value swing width is increased. Even if images are blurred as the AF value swing width is increased, since exposure is performed with high exposure energy, the shapes of patterns exposed with a small AF value swing width and the shapes of pattern exposed with a larger AF value swing width can be made uniform.

Obviously, the numerical values shown in FIGS. 10, 14A, and 14B are example values and can be set to arbitrary values. As is obvious as well, patterns are not limited to the four patterns PAa to PAd, and an arbitrary number of patterns can be transferred.

In the third embodiment, various settings, e.g., the AF value, the AF value swing width, and the information designating whether to continuously move the plate P in the optical axis direction of the projection optical system PL or move it stepwise, are stored in advance as part of the process program file in the RAM in the control unit CONT. However, an operation display unit connected to the control unit CONT may be configured to input various settings, e.g., selection of continuous movement of the plate P or stepwise movement of the plate P, and the number of steps in the stepwise movement mode, and the operator may input various settings through the operation display unit.

The third embodiment has exemplified the case wherein a plurality of patterns are respectively transferred onto different areas (shot areas) on the same layer of the plate P. However, the present invention is not limited to this. When exposure is to be performed to overlay patterns on a single shot area, at least one of an AF value and an AF value swing width may be set for each of patterns to be transferred onto different layers. A semiconductor device may be manufactured as follows. When a contact hole pattern is to be formed, the AF value swing width is set to a predetermined value to obtain a large depth of focus, and exposure may be performed while the plate P is moved in the optical axis direction of the projection optical system PL. When an interconnection pattern is to be formed, exposure may be performed while the plate P is fixed.

In addition, when a plurality of plates P to be exposed are grouped into one lot, at least one of an AF value and an AF value swing width may be set for exposure for each plate P in the lot.

The third embodiment has exemplified the case wherein a plurality of patterns are transferred onto different areas on the plate P. In this case, exposure may be performed to join these patterns to each other on the plate P (frame joining) so as to form one synthetic pattern. In this case, one synthetic pattern can be formed with high precision even on the plate P with poor flatness by performing joining exposure. When this frame joining is to be performed, the respective patterns may require different precisions, and AF values and AF value swing widths may be set accordingly. For this purpose, the patterns may be divisionally exposed for each required precision.

Figure 15A:
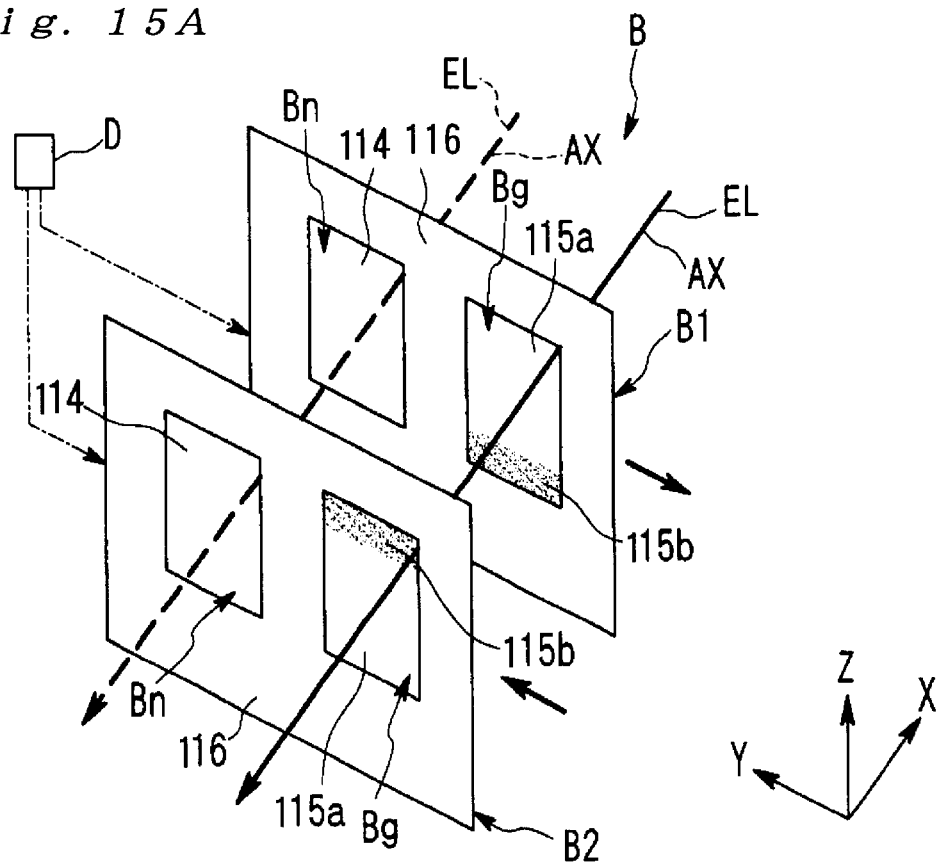
FIG. 15A is a schematic perspective view for explaining the arrangement of a blind portion.
Figure 15B:
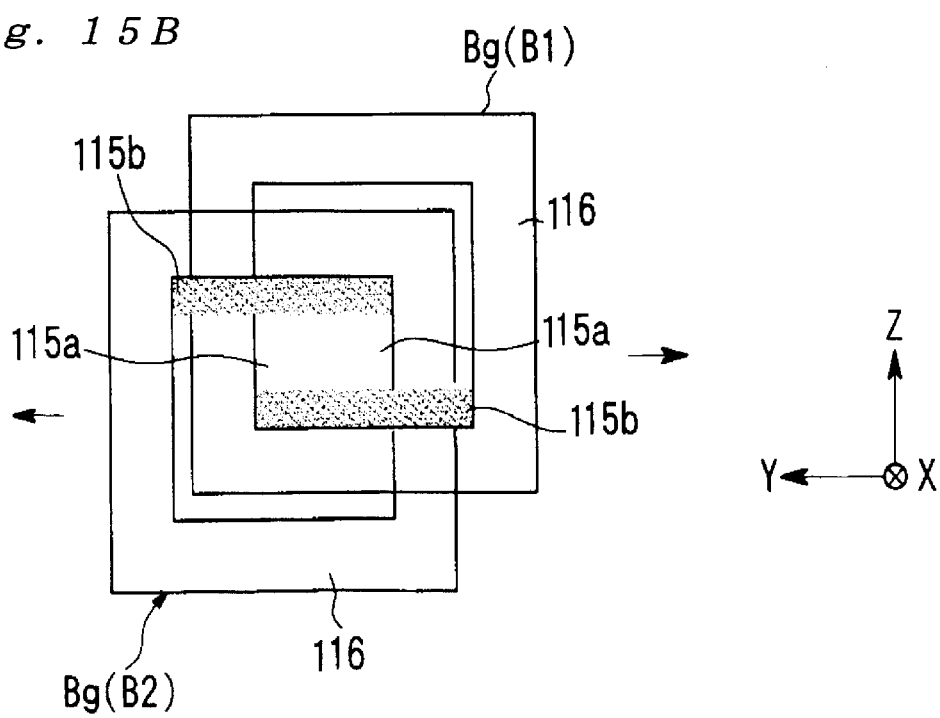
FIG. 15B is a view for explaining a method of using the blind portion in performing frame joining exposure.

Note that the blind portion B shown in FIGS. 15A and 15B can be used to perform frame joining. As shown in FIG. 15A, the blind portion B includes a light-source-side blind B1 and projection-optical-system-side blind B2. Each of the blinds B1 and B2 has a glass blind Bg and normal blind Bn which are integrally formed. In exposure processing for frame joining, the glass blind Bg is used. The glass blind Bg has a light-transmitting portion 115a formed by a transparent glass substrate. A light-shielding portion 116 is formed around the light-transmitting portion 115a. An attenuating portion 115b whose attenuation ratio increases from the light-transmitting portion 115a to the light-shielding portion 116 is formed at an end portion of the light-transmitting portion 115a. When frame joining is to be performed, the light-transmitting portions 115a of the glass blinds Bg are combined by a predetermined amount to set an illumination area for the mask M, as shown in FIG. 15B. Exposure is then performed such that attenuation areas on the plate P which correspond to the attenuating portions 115b are overlaid. With this operation, in the overlaying portion between the adjacent shot areas, the attenuation ratio of the attenuating portion 115b of one glass blind Bg and that of the other attenuating portion 115b change in opposite directions linearly, and hence exposure amounts can be made uniform throughout the entire area of the synthetic pattern including the overlaying portions.

Note that the attenuating portions 115b are formed at upper and lower portions (end portions in the Z direction) in FIGS. 15A and 15B but are not formed at side portions (end portions in the Y direction). However, such attenuation portions may be formed at side portions. In exposure processing, when exposure is performed while at least one of the glass blinds Bg on the light source side and projection optical system side is moved in the Y direction, the light amount distribution changes, and attenuation areas are also formed at end portions of the projection area in the Y direction. By overlaying these attenuation areas on the plate P, exposure amounts can be made uniform throughout the entire area of the synthetic pattern. A plurality of patterns are joined to each other on the plate P by using this blind portion B (glass blinds Bg) to form one synthetic pattern.

In the embodiment described above, the plurality of patterns PAa to PAd are formed on the plurality of masks Ma to Md, and exposure using the plurality of patterns PAa to PAd is performed while the plurality of masks Ma to Md are interchanged. However, the present invention is not limited to this; the plurality of patterns PAa to PAd may be formed on one mask M, and exposure may be performed while an AF value and AF value swing width are set for each pattern. In this case, for a pattern subject to exposure on the mask M, opening portions 114 of the two normal blinds Bn of the blind portion B are combined to set the size of an opening through which the exposure light EL passes, thereby irradiating only the pattern as the subject to exposure with exposure light while shielding other patterns, which are not to be exposed, against the exposure light with the light-shielding portion 116. When the glass blinds Bg and the normal blinds Bn are to be switched in exposure processing, the blinds B1 and B2 (the overall blind portion B) are moved in the Y direction in FIG. 15A and FIG. 15B by the driving mechanism D.

In the third embodiment, to change the illumination conditions for the illumination optical system every time each of patterns is transferred, as in the first embodiment, an aperture stop formed by a general circular aperture, a small aperture stop designed to reduce the a value, an annular aperture stop for annular illumination, and a deformation aperture stop formed by eccentrically positioning a plurality of apertures for a deformation light source method may be prepared and switched.

Note that exposure processing conditions for one substrate can be efficiently optimized by applying the method of the third embodiment to test exposure, i.e., performing exposure while changing the AF value and AF value swing width in test exposure.

In the third embodiment, the present invention is applied to the stepper. However, the present invention is not limited to this and can be suitably applied to a scanning exposure apparatus based on the step-and-scan method or the like. When, for example, the technique of switching exposure energy amounts for the respective patterns according to the third embodiment is to be applied to a scanning exposure apparatus, exposure energy can be independently set for exposure for each of a plurality of patterns by switching scanning speeds for the respective patterns while continuously moving the plate P in the optical axis direction of the projection optical system PL and reciprocally scanning the mask M and plate P. In the scanning exposure apparatus, to scan a slit-like exposure area with respect to the plate P, AF values and AF value swing widths are set for the respective patterns, and the AF values and AF value swing widths are continuously switched every time the pattern changes during scanning.

In the first and second embodiments, the present invention is applied to the exposure apparatus for manufacturing semiconductor devices. In the third embodiment, the present invention is applied to the exposure apparatus used to manufacture liquid crystal display devices (displays). However, the present invention is not limited to them and can be applied to an exposure apparatus for transferring device patterns onto ceramic wafers, which is used to manufacture thin-film magnetic heads, an exposure apparatus used to manufacture image pickup devices (such as CCDs), etc. In addition, the present invention can be applied to an exposure apparatus for transferring a circuit pattern onto a glass substrate, silicon wafer, or the like to manufacture a reticle or mask which is used in a light exposure apparatus, EUV exposure apparatus, X-ray exposure apparatus, electron beam exposure apparatus, etc. as well as microdevices such as semiconductor devices. In this case, in an exposure apparatus using DUV (Deep UltraViolet) light, VUV (Vacuum UltraViolet) light, or the like, a transmission type reticle is generally used. As a reticle substrate, silica glass, fluorine-doped silica glass, fluorite, magnesium fluoride, quartz, or the like is used. In a proximity type X-ray exposure apparatus, electron beam exposure apparatus, or the like, a transmission type mask (stencil mask or membrane mask) is used, and a silicon wafer or the like is used as a mask substrate.

The light source of the exposure apparatus of the present invention is not limited to a mercury lamp, KrF excimer laser (248 nm), ArF excimer laser (193 nm), $F_2$ laser (157 nm), and the like. The present invention can be suitably applied to an exposure apparatus using vacuum ultraviolet light such as $Kr_2$ laser light having a wavelength of 146 nm or $Ar_2$ laser light having a wavelength of 126 nm.

A harmonic may be used, which is obtained by amplifying a single-wavelength laser beam in the infrared or visible range, which is emitted from a DFB semiconductor laser or fiber laser, with a fiber amplifier doped with erbium (or both erbium and ytteribium), and wavelength-converting the light into ultraviolet light by using a nonlinear optical crystal.

If, for example, the oscillation wavelength of a single-wavelength laser is set within the range of 1.51 to 1.59 $\mu$m, an eighth harmonic whose generation wavelength falls within the range of 189 to 199 nm or a 10th harmonic whose generation wavelength falls within the range of 151 to 159 nm is output. If the oscillation wavelength is set in the range of 1.544 to 1.553 $\mu$m, in particular, an eighth harmonic whose generation wavelength falls within the range of 193 to 194 nm, i.e., ultraviolet light having almost the same wavelength as that of an ArF excimer laser beam, can be obtained. If the oscillation wavelength is set within the range of 1.57 to 1.58 $\mu$m, a 10th harmonic whose generation wavelength falls within the range of 157 to 158 nm, i.e., ultraviolet light having almost the same wavelength as that of an $F_2$ laser beam, can be obtained.

If the oscillation wavelength is set within the range of 1.03 to 1.12 $\mu$m, a seventh harmonic whose generation wavelength falls within the range of 147 to 160 nm is output. If the oscillation wavelength is set within the range of 1.099 to 1.106 $\mu$m, in particular, a seventh harmonic whose generation wavelength falls within the range of 157 to 158 $\mu$m, i.e., ultraviolet light having almost the same wavelength as that of an $F_2$ laser beam, can be obtained. In this case, as a single-wavelength oscillation laser, for example, an ytteribium-doped fiber laser can be used.

Obviously, the projection optical system and illumination optical system in the each embodiment described above are merely examples, and the present invention is not limited to them. For example, as a projection optical system, not only a refraction optical system but also a reflection system constituted by only reflection optical elements or reflection/ refraction system (catadioptric system) including reflection optical elements and refraction optical elements may be used. In an exposure apparatus using a vacuum ultraviolet light (VUV light) having a wavelength of about 200 nm or less, a reflection/refraction system may be used as a projection optical system. As this reflection/refraction type projection optical system, one of the following systems can be used: a reflection/refraction system having a beam splitter and concave mirror as reflection optical elements, which is disclosed in, for example, U.S. Pat. No. 5,668,672 and U.S. Pat. No. 5,835,275, and a reflection/refraction system having a concave mirror and the like as reflection optical elements without using any beam splitter, which is disclosed in, for example, U.S. Pat. No. 5,689,377 and U.S. patent application Ser. No. 873,605 (application date: Jun. 12, 1997). Note that the disclosures in the above references are incorporated in the specification of the present invention.

In addition, the reflection/refraction system disclosed in U.S. Pat. Nos. 5,031,976, 5,488,229, and 5,717,518 may be used, in which a plurality of refraction optical elements and two mirrors (a main mirror which is a concave mirror, and a sub-mirror which is a rear mirror having a reflecting surface formed on a surface of a refraction element or plane-parallel plate which is located on the opposite side to the incident surface) are arranged coaxially, and an intermediate image of a reticle pattern formed by the plurality of refraction optical elements is formed again on a wafer by the main mirror and sub-mirror. In this reflection/refraction system, the main mirror and sub-mirror are arranged following the plurality of refraction optical elements, and illumination light passes through a portion of the main mirror to be sequentially reflected by the sub-mirror and main mirror, and reaches the wafer through a portion of the sub-mirror. Note that the disclosures in the above references are incorporated in the specification of the present invention.

As the projection optical system PL, a reduction magnification system, one-to-one magnification system, or enlargement magnification system can be used.

As a driving system for the wafer stage, plate stage, reticle stage, or mask stage, the linear motor disclosed in U.S. Pat. No. 5,623,853 or 5,528,118 may be used. In this case, the motor may be of an air levitation type using an air bearing or magnetic levitation type using Lorentz force or reactance force. In addition, the stage may be of a type that moves along a guide or a guide-less type having no guide.

When a plane motor is to be used as a driving unit for a stage, one of a permanent magnetic unit (permanent magnet) and an armature unit may be connected to the stage, and the other of the permanent magnetic unit and the armature unit may be mounted on the moving surface side (base) of the stage.

The reaction force generated upon movement of the wafer stage or plate stage may be mechanically relieved to the floor (ground) by using a frame member as disclosed in, for example, Japanese Patent Laid-Open No. 8-166475 and corresponding U.S. Pat. No. 5,528,118. Note that the disclosures in the above references are incorporated in the specification of the present invention.

In addition, the reaction force generated upon movement of the reticle stage or mask stage may be mechanically relieved to the floor (ground) by using a frame member as disclosed in, for example, Japanese Patent Laid-Open No. 8-330224 and corresponding U.S. Pat. No. 5,874,820. Note that the disclosures in the above references are incorporated in the specification of the present invention.

As described above, the exposure apparatus of the present invention is manufactured by assembling various subsystems including the constituent elements presented in the appended claims so as to keep a predetermined mechanical precision, electrical precision, and optical precision. Before and after this assembly, to ensure these precisions, adjustment for achieving the predetermined optical precision is performed for various optical systems; adjustment for achieving the predetermined mechanical precision, for various mechanical systems; and adjustment for achieving the predetermined electrical precision, for various electrical systems. The steps of assembling various subsystems into an exposure apparatus include mechanical connection of various subsystems, wiring of electric circuits, piping of pressure circuits, and the like. Obviously, the steps of forming the respective subsystems are performed before the step of assembling the subsystems into the exposure apparatus. After the step of assembling the respective subsystems into the exposure apparatus, overall adjustment is performed to ensure the respective precisions of the overall exposure apparatus. Note that the exposure apparatus is preferably manufactured in a clean room in which temperature, cleanliness, and the like are controlled.

Figure 16:
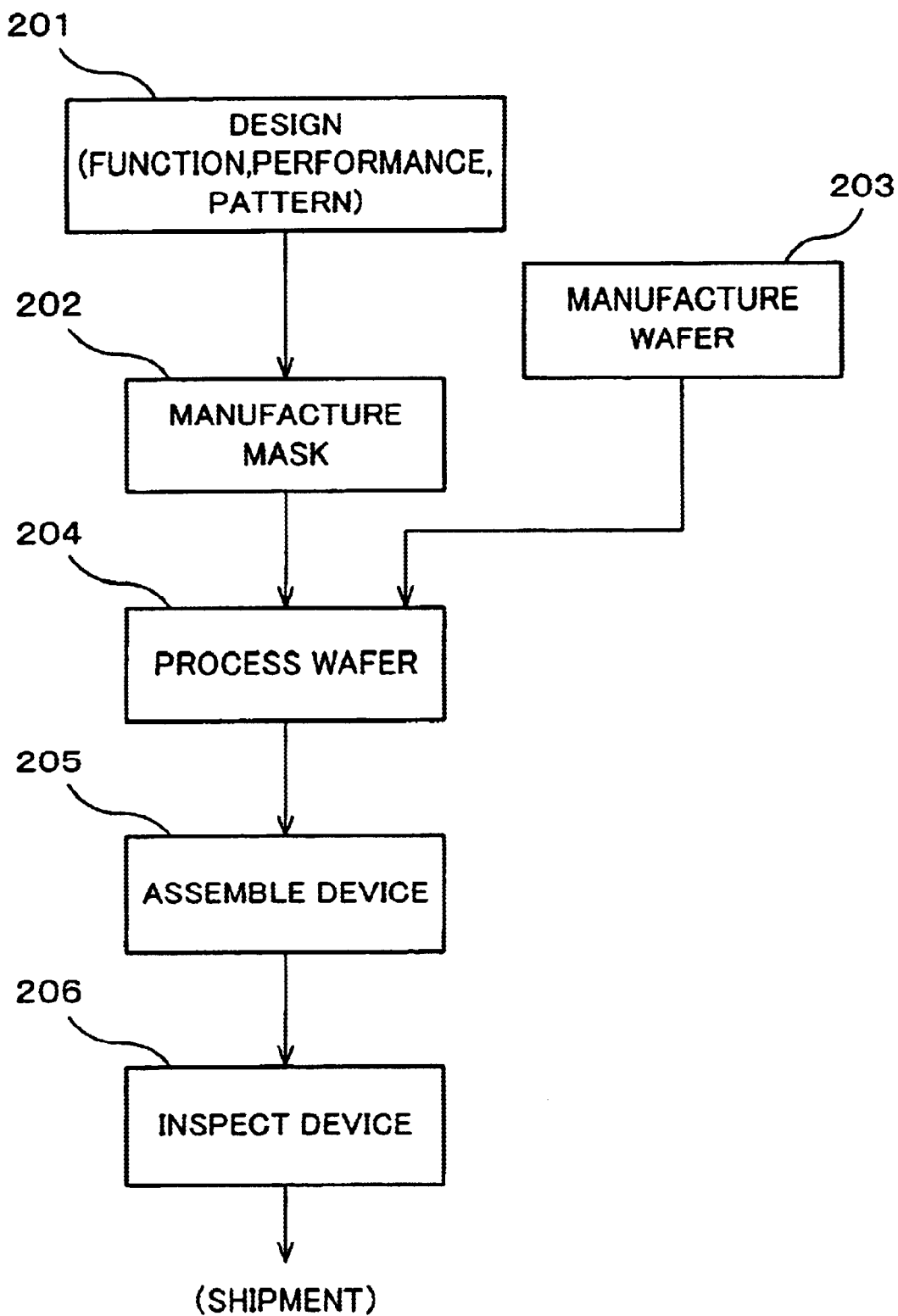
FIG. 16 is a flow chart showing an example of a manufacturing a device.

A device (a semiconductor chip such as an IC or LSI, a liquid crystal panel, a CCD, a thin magnetic head, a micromachine, or the like) is manufactured, for example, in the following steps as shown in FIG. 16. That is, in step 201 (design step), function/performance is designed for a device (e.g., circuit design for a semiconductor device). In step 202 (mask manufacturing step), a reticle (mask) on which the circuit pattern is formed on the basis of the design step is manufactured. In step 203 (substrate manufacturing step), a substrate (wafer or glass plate, etc.) serving as a material of the device is manufactured.

In step 204 (substrate processing step), an actual circuit and the like are formed on the wafer by lithography or the like using the wafer and reticle (mask) prepared in steps 201 to 203. In step 205 (device assembly step), a device is assembled by using the substrate processed in step 204. Step 205 includes processes such as dicing, bonding, and packaging. Finally, in step 206 (inspection step), a test on the operation of the device, durability test, and the like are performed. After these steps, the device is completed and shipped out.

For example, in the case of a semiconductor device, the above wafer processing step includes oxidation step wherein the surface of the wafer is oxidized, CVD step wherein an insulating film is formed on the wafer surface, electrode formation step wherein an electrode is formed on the wafer by vapor deposition, and ion implantation step wherein ions are implanted into the wafer. These steps described above constitute a pre-process for the respective steps in the wafer process and are selectively executed in accordance with the processing required in the respective steps. When the above pre-process is completed in the respective steps, a post-process is executed. This post-process includes resist formation step wherein the wafer is coated with a photosensitive agent, exposure step wherein the circuit pattern on the mask is transferred onto the wafer by using the exposure apparatus and method in the above embodiments, developing step wherein the exposed wafer is developed, etching step wherein an exposed member on a portion other than a portion where the resist is left is removed by etching, and resist removing step wherein the unnecessary resist after the etching is removed, etc. By repeatedly performing these pre-process and post-process steps, multiple circuit patterns are formed on the wafer.

As described above, according to the device manufacturing method, in the exposure step as well as the resist formation step and developing step constituting the lithography process, by using the exposure apparatus and exposure method described in each above embodiment, the patterns on the reticle are transferred on the wafer. This results in suppressing the variation in shapes of the pattern images formed on the substrate, thus improving the productivity of the device as a final product and the yield.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure method of irradiating a mask on which a pattern is formed with an energy beam; and changing a positional relationship between an imaging plane of a projection optical system and a substrate in an optical axis direction of said projection optical system according to a predetermined procedure so that an irradiation area on a substrate surface irradiated with said energy beam through said projection optical system is always located in a range having a predetermined width in said optical axis direction and including said imaging plane, and a distribution of energy supplied onto said substrate surface in the optical axis direction becomes a desired distribution, thereby transferring said pattern onto said substrate, said method comprising:

obtaining a plurality of energy distributions in the optical axis direction in accordance with a position on said substrate of said area and storing the plurality of energy distributions in advance; and transferring said pattern onto said substrate, wherein the distribution of energy is changed in accordance with the position on said substrate of said area based on said plurality of energy distributions stored in advance.

2. An exposure method according to claim 1, wherein said positional relationship between said imaging plane and said substrate in said optical axis direction of said projection optical system is continuously changed.

3. An exposure method according to claim 1, wherein said positional relationship between said imaging plane and said substrate in said optical axis direction of said projection optical system is intermittently changed.

4. An exposure method according to claim 1, wherein a plurality of divided areas are set on said substrate, and said distribution of energy is changed in accordance with a position on said substrate of a divided area subject to exposure.

5. An exposure method according to claim 1, wherein said distribution of energy corresponding to a position on said substrate is a distribution having peaks at a plurality of points including at least two points located near two end portions of said range having said predetermined width on said substrate surface with datum to said imaging plane while a predetermined integrated energy is supplied to each point on said substrate.

6. An exposure method according to claim 1, wherein said distribution of energy is changed by changing said predetermined width.

7. An exposure method according to claim 1, wherein an integrated energy amount supplied to each point in an area irradiated with said energy beam is further changed in accordance with a position on said substrate of said area.

8. An exposure method of irradiating a mask on which a pattern is formed with an energy beam, and a position of a substrate in an optical axis direction of a proiection optical system is swung according to a predetermined procedure so that an irradiation area on a substrate surface irradiated with said energy beam through said projection optical system is always located in a range having a predetermined width in said optical axis direction and including said imaging plane, and a distribution of energy supplied onto said substrate surface in the optical axis direction becomes a desired distribution, thereby transferring said pattern onto said substrate, said method comprising:

obtaining a plurality of swing widths of the substrate in the optical axis direction in accordance with a position on said substrate of said area and storing the plurality of swing widths in advance; and transferring said pattern onto said substrates wherein a swing width is changed in accordance with a position on said substrate of said area based on said plurality of swing widths stored in advance.

9. An exposure method according to claim 8, wherein said positional relationship between said imaging plane and said substrate in said optical axis direction of said projection optical system is continuously changed.

10. An exposure method according to claim 8, wherein said positional relationship between said imaging plane and said substrate in said optical axis direction of said projection optical system is intermittently changed.

11. An exposure method according to claim 8, wherein a plurality of divided areas are set on said substrate, and said distribution of energy is changed in accordance with a position on said substrate of a divided area subject to exposure.

12. An exposure method of irradiating a pattern with an energy beam and changing a positional relationship between an imaging plane of a projection optical system and a substrate in an optical axis direction of said projection optical system according to a predetermined procedure so that an irradiation area on a substrate surface irradiated with said energy beam through said projection optical system is always located in a range having a predetermined width in said optical axis direction and including said imaging plane, and a distribution of energy supplied onto said substrate surface with respect to a position of said substrate surface with datum to said imaging plane becomes a desired distribution, thereby transferring said pattern onto said substrate, said method comprising:

preparing a plurality of patterns;

obtaining a plurality of energy distributions in the optical axis direction in accordance with said plurality of patterns subject to transfer and storing said plurality of energy distributions in advance; and transferring each of said plurality of patterns onto said substrate, wherein the distribution of energy is changed in accordance with a pattern subject to transfer based on said plurality of energy distributions stored in advance, upon transferring each of said plurality of patterns onto said substrate.

13. An exposure method according to claim 12, wherein said positional relationship between said imaging plane and said substrate in said optical axis direction of said projection optical system is continuously changed.

14. An exposure method according to claim 12, wherein said positional relationship between said imaging plane and said substrate in said optical axis direction of said projection optical system is intermittently changed.

15. An exposure method according to claim 12, wherein an integrated energy amount supplied to each point in an area on said substrate which is irradiated with said energy beam is changed in accordance with said pattern subject to transfer.

16. An exposure method according to claim 12, wherein said plurality of patterns are dispersed on a plurality of different masks.

17. An exposure method of irradiating a plurality of patterns with energy beams, and transferring said plurality of patterns onto a substrate by using a projection optical system, said method comprising:

obtaining a plurality of swing widths of said substrate in said optical axis direction of said projection optical system in accordance with said plurality of patterns subject to transfer and storing the plurality of swing widths in advance; and transferring each of said plurality of patterns onto said substrate, wherein a swing width of said substrate in said optical axis direction of said projection optical system is changed in accordance with a pattern subject to transfer based on said plurality of swing widths stored in advance, upon transferring each of said plurality of patterns onto said substrate.

18. An exposure method according to claim 17, wherein said setting is performed in accordance with at least one of a position of said imaging plane and a depth of focus in said projection optical system.

19. An exposure method according to claim 17, wherein said plurality of patterns onto different areas on said substrate are transferred.

20. An exposure method according to claim 17, wherein said plurality of patterns onto adjacent areas on said substrate are transferred so as to join said patterns to each other.

21. An exposure method according to claim 17, wherein an integrated energy amount to be supplied to each point in an area on said substrate which is irradiated with said energy beam is independently set in accordance with said pattern subject to transfer.

22. An exposure method according to claim 17, wherein said plurality of patterns are dispersed on a plurality of masks, and said plurality of masks are sequentially interchanged and said plurality of patterns are transferred onto said substrate.

23. A device manufacturing method including a lithography process, wherein said lithography process uses the exposure method according to claim 1.

24. A device manufacturing method including a lithography process, wherein said lithography process uses the exposure method according to claim 8.

25. A device manufacturing method including a lithography process, wherein said lithography process uses the exposure method according to claim 12.

26. A device manufacturing method including a lithography process, wherein said lithography process uses said exposure method according to claim 17.

* * * * *